United States Patent
Wischnewskiy

[11] Patent Number: 5,872,418
[45] Date of Patent: Feb. 16, 1999

[54] PIEZOELECTRIC MOTOR

[75] Inventor: Wladimir Wischnewskiy, Münchenbernsdorf, Germany

[73] Assignee: PI Ceramic GmbH, Muenchenbernsdorf, Germany

[21] Appl. No.: 817,496

[22] PCT Filed: Oct. 23, 1995

[86] PCT No.: PCT/EP95/04148

§ 371 Date: Apr. 15, 1997

§ 102(e) Date: Apr. 15, 1997

[87] PCT Pub. No.: WO96/13868

PCT Pub. Date: May 9, 1996

[30] Foreign Application Priority Data

Oct. 31, 1994 [DE] Germany .................. 44 38 876.4
Jun. 17, 1995 [DE] Germany .................. 195 22 072.2

[51] Int. Cl.$^6$ ................................................. H01L 41/08
[52] U.S. Cl. ................................. 310/323; 310/316
[58] Field of Search ............................. 310/323, 328, 310/316, 317, 319

[56] References Cited

U.S. PATENT DOCUMENTS

| | | | |
|---|---|---|---|
| 4,019,073 | 4/1977 | Vishnevsky et al. | 310/323 |
| 4,504,760 | 3/1985 | Yamamoto et al. | 310/323 |
| 4,562,374 | 12/1985 | Sashida | 310/328 |
| 4,678,956 | 7/1987 | Izukawa et al. | 310/323 |
| 4,723,085 | 2/1988 | Mukohjima et al. | 310/323 |
| 4,768,256 | 9/1988 | Motoda | 310/323 X |
| 4,814,660 | 3/1989 | Yamada et al. | 310/328 |
| 4,893,047 | 1/1990 | Honda | 310/323 |
| 5,148,068 | 9/1992 | Kushida et al. | 310/323 X |
| 5,336,958 | 8/1994 | Saya et al. | 310/323 |

FOREIGN PATENT DOCUMENTS

| | | |
|---|---|---|
| 02 97 574 A2 | 1/1989 | European Pat. Off. . |
| 03 60 975 A2 | 4/1990 | European Pat. Off. . |
| 04 24 141 A2 | 4/1991 | European Pat. Off. . |
| 04 95 665 A1 | 7/1992 | European Pat. Off. . |
| 05 38 791 A1 | 4/1993 | European Pat. Off. . |
| 31 34 488 A1 | 7/1982 | Germany . |
| 39 04 070 A1 | 9/1989 | Germany . |
| 39 27 040 A1 | 2/1991 | Germany . |
| 42 44 704 A1 | 3/1994 | Germany . |
| 43 05 894 C1 | 8/1994 | Germany . |

*Primary Examiner*—Mark O. Budd
*Attorney, Agent, or Firm*—Jordan and Hamburg

[57] ABSTRACT

A piezoelectric motor achieves maximum mechanical performance, high safety of operation and low costs with a negligible exciting voltage. The piezoelectric engine has a stator whose oscillator designed as a closed waveguide is provided with at least one generator of an elastic travelling wave for the waveguide. A rotor is frictionally engaged by a functional surface of the oscillator. The elastic travelling wave generator is as long as the generated wavelength and consists of a base generator and two supplementary generators that generate elastic longitudinal stationary waves having the same amplitude and wavelength. The stationary waves are offset with respect to the wave generated by the base generator by ±1/3 of the wavelength along the waveguide. Exciting sources are associated with the base generator and the supplementary generators. The supplementary generators and their exciting sources are designed in such a way that the stationary waves they generate are phase shifted by ±2/3 π with respect to the stationary wave generated by the base generator. The length of the waveguide is the same as the wavelength of the stationary wave or is an integral multiple thereof.

18 Claims, 35 Drawing Sheets

PIEZOELECTRIC MOTOR

BACKGROUND OF THE INVENTION

The invention relates to a piezoelectric motor, particular for use as miniature electrical motors adapted for continuous or stepped rotational movements. The motor according to the invention can be used in automation systems, in robot techniques, in machine tools to precisely position cutters, in vehicles as screen wiper motors and pane lifter motors and as a drive means for seat adjustments. It can also be used in inertialess drive means for TV aerials and other devices which require a great moment of rotation at a comparatively low speed of rotation.

Piezoelectric motors are known in which the electrical energy is converted into a rotational motion of a rotor by means of piezoelectric oscillators which comprise two resonators of two different standing waves as disclosed in the U.S. Pat. Specification No. 4,019,073, for example. With this kind of motor it is difficult to match the two different types of standing waves over a wide range of temperature as well as under mechanical stress. Said disadvantage is not inherent in piezoelectric motors which are based on the principle of generating acoustic travelling waves by means of uniform standing waves (refer to Axel Fröschler, Analyse eines Piezo-Wanderwellenmotors, Dissertation, Stuttgart, 1992, pg. 48 ff.). These motors are disadvantageous due to the use of acoustic waves which require the piezoelement which generates the travelling wave being embodied as a thin ring cemented by an elastic organic adhesive to a metallic waveguide.

Due to the use of elastic waves and due to the small volume of the piezoelement, compared to the entire volume of the waveguide, the efficiency factor of the electromechanic energy conversion is low which requires a considerable increase of the excitation voltage for the motor. The connection between the piezoelement and the metallic waveguide by means of an organic adhesive restricts the maximum mechanical motor output, reduces its efficiency factor and the reliability. The piezoelement of a motor employing such waves exhibits differently oriented polarizations which renders the manufacture difficult and the motor expensive so that piezoelectric travelliing wave motors cannot compete with the cheap electromagnetic motors.

SUMMARY OF THE INVENTION

It is an object of the present invention to provide a piezoelectric motor including a highly efficient oscillator which ensures, at a low excitation voltage, a maximum mechanical output, a high reliability, and a low price.

It is a further object to provide a piezoelectric motor in which a travelling wave is generated in a monolithic piezoelectric oscillator by generating acoustic longitudinal waves of equal amplitude, said travelling wave circularly moves a the friction face of the oscillator under continuous elastic contact to a rotor and applies a torque to the rotor via a points moving along a closed path on the oscillator surface.

The objects are realized because the maximum feasible bulk of the motor according to the invention is selected from a piezoelectric material, preferably from ceramics, and is used for the generation of acoustic waves the motor exhibits an effective electromechanical coefficient, which involves a considerable reduction of the excitation voltage. Additionally, the solution suggested by the invention omits cementing the piezoelement to the waveguide by adhesives which predominantly consist of organic components. This permits a maximum mechanical stress on the oscillator of the motor, only limited by the stability of the ceramics, and, hence, a maximum mechanic output. The piezoelement of the motor is unidirectionally polarized which simplifies its manufacture in contrast to comparable electromagnetic motors and renders it inexpensive.

The present invention can be realized by different modifications. In, for example, a simple embodiment of the invention it is feasible to coordinate two independent generators for standing waves to a third generator depending on the two first generators, the third generator being controlled by the two first generators in such a manner that it cooperates with them as a voltage divider with respect to the voltage supplied by a voltage generating unit and as an adding operator with respect to the voltage divided by the first two generators. The three generators are mounted on a cylindrical, conical or disk-shaped piezoelectric bulk. This embodiment permits a simplification of the construction since it does without an excitation source for the standing wave generators. A further advantageous embodiment of the invention is obtained when the closed waveguide is embodied as a cylindrical bulk made of piezoceramics in which the standing wave generators are constituted as sections of parallel electrodes. With this modification the entire oscillator bulk operates as the piezoelectric active medium, and such a motor exhibits a feasible maximum electromechanical coefficient. In this case, the electric excitation voltage for the motor is a minimum. Since the oscillator design omits any cemented joints using organic adhesives, a maximum permissible mechanical stress can be produced in the oscillator, only limited by the material strength of the waveguide. This yields a maximum of oscillating motions of the points on the operation face of the oscillator resulting, in turn, in a maximum mechanical output at the motor axle. The absence of any cemented joint using organic adhesives reduces the mechanical losses within the oscillator and enhances the efficiency. Additionally, the reliability of the motor is increased, since a decomposition of cemented joints at a high excitation level is eliminated. With a further advantageous embodiment the closed waveguide is in shape of a passive cylindrical bulk made of metal or ceramics, the standing wave generators being embodied in such a manner that packets of piezoelectric transducers are arranged upon them. In this case the oscillator of the motor can have any desired dimensions. The latter are not limited by manufacturing technology for the piezoelectric cylinders. Thus it feasible to produce piezoelectric power motors of some kilowatt output.

According to the invention the operation face of the oscillator is preferably provided with a thin wear-resistant friction layer being in operational contact with the rotor. This embodiment permits the friction parameters of the operation face of the oscillator to be set which enhances the rotation moment of the motor.

In one embodiment of the invention the friction layer can be entirely made of a material forming a chemical compound with the piezoelectric ceramics such as glass, metal, or any other suitable material. A motor in which the friction layer forms a chemical compound with the oscillator non-destructively operates up to the maximum permissible mechanical stress of the oscillator. With a further advantageous solution the friction layer is constituted of a base layer and an intermediate layer. The base determines the friction properties and the intermediate layer forms a chemical compound with the piezo material. Such an embodiment considerably multiplies the number of suitable friction materials. In the subsequent modification the frictional layer consists of a mixture of material based upon a material which forms a chemical compound with the piezoceramics and, as a filler, uses a material which raises the friction coefficient of the friction layer. With this embodiment the desired wave resistance of the friction layer can be selected by varying the ratio between the materials used. In still another embodiment the friction layer can be made of a porous material exhibiting a high friction coefficient and a high mechanical strength, the pores of said material being filled with a material forming a chemical compound with the piezoceramics. In this manner it is feasible to manufacture considerably solid friction layers which ensure a long run of the motor in step operation.

Advantageously, power amplifiers are employed for the electrical circuitry of the piezoelectric motor, said amplifiers being connected via a phase shifting chain to the excitation source of the basic generator and being the excitation sources for boosters. This embodiments permits a sharp tuning of the generators over a wide range as concerns temperature as well as mechanical load which improves the reliability of the inventional motor.

Furthermore, in a preferable embodiment, it is feasible to provide the excitation sources of the boosters with means for reversal of the phase angle of the signal. This permits a reversal of the rotation direction of the rotor. According to the invention it is also feasible to constitute the basic generator by a frequency controlled voltage generator which has one frequency input. Such a modification permits a steady control of the excitation source frequency.

In a further modification the piezoelectric motor is embodied in such a manner that the basic generator has a positive feedback of the standing waves and to its excitation source and, in combination, constitute an electromechanical autogenerator, the frequency of the standing wave generators always being in the range of the resonance frequency of the oscillator, thus enhancing the rotation frequency stability of the rotor.

In an embodiment of the motor it is feasible to connect the positive feedback branch to an impedance element which, in turn, is series-connected to the standing wave basic generator. It is also feasible to connect the positive feedback branch to a current transformer series-connected to the standing wave basic generator.

Finally, the positive feedback branch can be connected to the feedback electrode which, due to the standing waves produced by the generator, is arranged at the locus where the maximum mechanical stress occurs.

The last three embodiments mentioned ensure a safe excitation of the electromechanical generator at the oscillator resonance frequency. A further advantageous embodiment of the motor is provided with an electronic circuit for disconnecting the positive feedback branch. In this case a step control can easily be carried out which permits application for step-motors.

BRIEF DESCRIPTION OF THE DRAWINGS

Further features of the invention become obvious from the following descriptions of the Figures. By virtue of the schematical drawings the invention will be explained in more detail by thirty-four embodiments.

The Figures show in:

According to FIG. 1a piezoelectric motor comprises a stator 1 including a cylindrical oscillator 2 in the shape of a closed waveguide 3 made of piezoelectric ceramics. The waveguide 3 is provided with at least one generator 4 for producing an elastic travelling wave in the bulk of the waveguide 3. In the embodiment shown, a rotor 6 is forced by its own weight against a front face 5 (operation face) of the oscillator 2. A second non-operational face 7 of the oscillator 2 rests upon an elastic sound-isolating base 8 arranged in a not shown housing of the device. A travelling wave generator 4 comprises a basic generator 9 and two additional generators (boosters) 10, 11 for producing standing waves. Each of the generators 9, 10, 11 occupies equally large sections 12, 13, 14 of the cylindric wave guide 3 and is constituted of two parallel electrodes 15, 16 with intermediate piezoelectric ceramics. Each of the electrodes 15, 16 represents current carrying metallic layers attached in longitudinal direction to the cylindrical wave-guide 3. To activate the generators 9, 10, 11 the piezoelectric ceramics provided between the electrodes 15, 16 is polarized normally relative to said electrodes 15,16. In FIG. 1 and in the subsequent FIGS. the polarization is indicated by the arrows 150.

Each of the standing wave generators has an excitation source (voltage source) 17, 18, 19. The contacts 20, 21 of each excitation source 17, 18, 19 are connected to electrodes 15 and 16 of respective generators 9, 10, 11. The respective voltages $U_1 = U \cdot \sin \omega t$, $U_2 = U \cdot (\sin \omega t \pm 120°)$, $U_3 = U \cdot \sin (\omega t \pm 120°)$ are applied across the contacts 20, 21 and, thus, across the electrodes 15, 16 of the standing wave generators 9, 10, 11.

Figure 2:
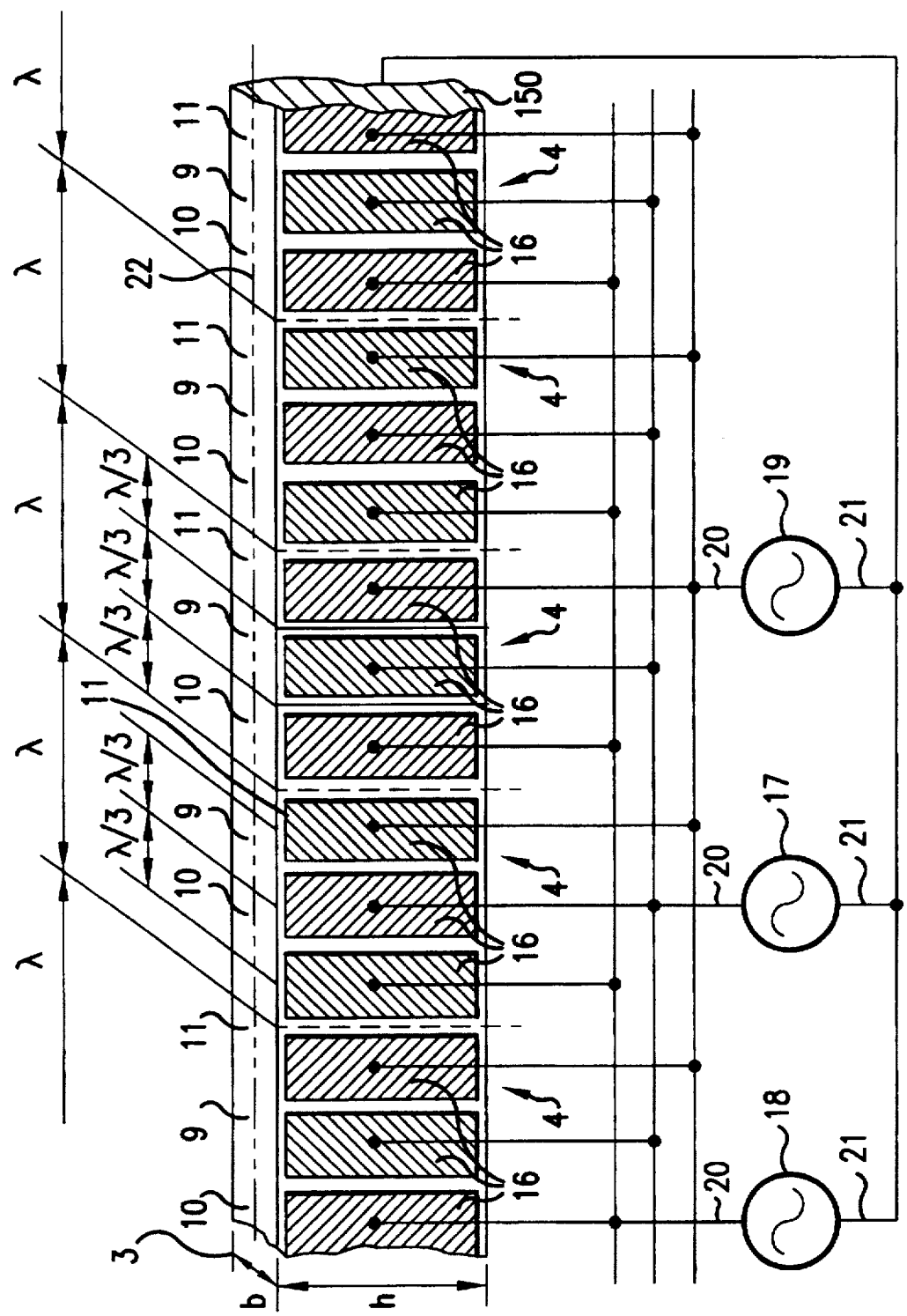
FIG. 2 a schematic view of an oscillator.
Figure 3:
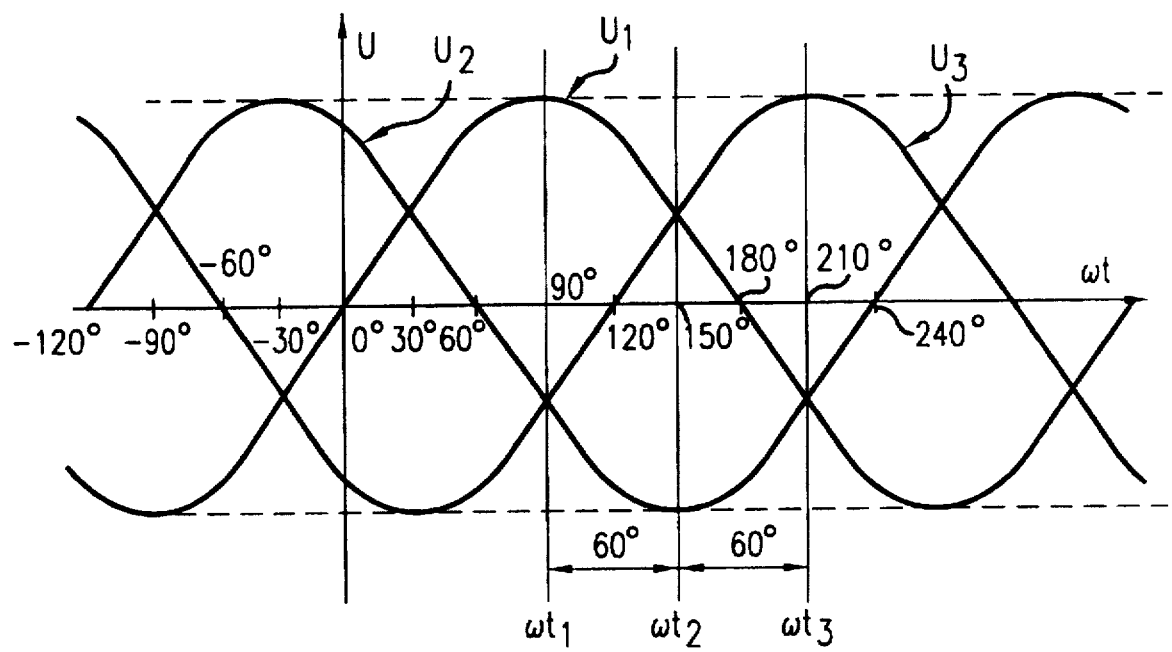
FIG. 3 an excitation voltage diagram.

In FIG. 2 a schematic of the cylindrical wave guide 3 is shown, indicating a height h and a width b. The length of the wave guide 3 considered along the central line 22, has to be an integer multiple of a wavelength $\lambda$ being produced by the standing wave generators 9, 10, 11 in the waveguide. The length of each standing wave generator 9, 10, 11, considered along the central line 22, is $\lambda/3$. The boosters 10, 11 are shifted by a respective amount of $\pm \lambda/3$ relative to the basic generator 9, considered along the central line 22. Each group of standing wave generators 9, 10, 11 constitutes a travelling wave generator 4. The space occupied by a travelling wave generator 4 along the central line of the cylindrical waveguide 3 equals the wavelength $\lambda$. The number of generators 4 can be selected as desired and depends on the length of the central line 22 of the waveguide 3. The waveguide 3, shown in FIG. 2, has five travelling wave generators. The five generators 4 are electrically connected in parallel. Such a circuit means that the contacts 20 of each excitation source 17, 18, 19 are connected to the respective electrode 16 of the generators 9, 10, 11. In FIG. 2 the connections 21 of the excitation sources 17, 18, 19 are connected with one another and connected to the electrode 15 which is the common electrode of the generators 9, 10, 11. The excitation sources 17, 18, 19 supply sine-shaped voltages of equal amplitude and equal frequency, phase-shifted to one another. The phase-shift of the electrical voltages of the excitation sources 18, 19 relative to the voltage of the excitation source 17 is $\pm 2/3 \pi$ ($\pm 120°$). FIG. 3 shows diagrams of the voltage curves. The voltage $U_1$ is supplied from the excitation source 17, the voltage $U_2$ from the excitation source 18, and the voltage $U_3$ from the excitation source 19.

Figure 4:
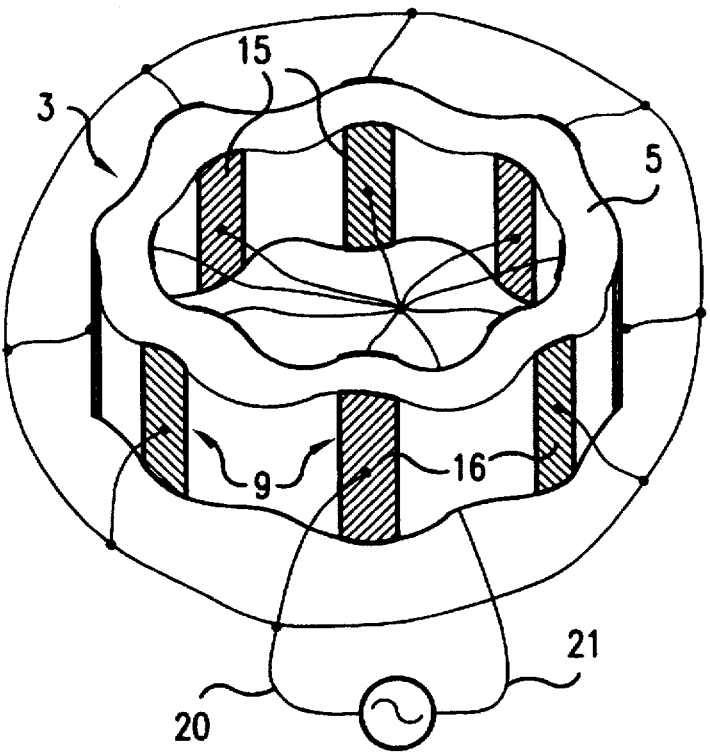
FIG. 4 a standing wave deformation of an oscillator with an excitation voltage applied, FIG. 5 a diagram of an excitation voltage, FIG. 6 an instantaneous state of an operational face of the oscillator when generating a standing wave, FIG. 7 diagrams for representing superimposition process when deforming the operation face, FIG. 8 a complete representation of the path of travel of points on the oscillator operational face when generating a standing wave, FIG. 9 another representation of the path of travel of points on the oscillator operational face when generating a standing wave, FIG. 10 a representation of the development of path of travel of a point with the oscillator operation face, FIG. 11 a representation of the phase movements of points of the oscillator operation face, FIGS. 12a–12d feasible lines of movement of points on the operation face, FIGS. 13a–13c an elementary volume of an oscillator and its equivalent circuit diagram, FIG. 14 a complete equivalent circuit diagram of the oscillator, FIG. 15 a simplified equivalent circuit diagram of said oscillator, FIGS. 16a–16f the electromechanical parameters of the motor, FIGS. 17a–17h oscillator modifications, FIGS. 18a–18e modifications of wear-resistant layers.

In FIG. 4 a longitudinal standing wave is shown in the waveguide 3 and, hence, in its operational face 5 which is produced by one of the generators 9, 10, 11, the respective generator being excited via a sine-shaped voltage $U_i = U \cdot \sin \omega t$ of the respective excitation source 17, 18, 19. The waveguide 3, shown in FIG. 4 has eight parallel connected equal standing wave generators 9, 10 or 11. Said generators produce a standing wave having sixteen maxima and minima, respectively. The number of equal generators 9, 10, 11 is determined by die number of travelling wave generators 4. During operation of the motor the standing wave generators 9, 10, 11 independently produce three standing waves of equal amplitude and frequency which are spatially shifted to one another by $\lambda/3$ along the central line 22 (FIG. 2) of the waveguide 3. The phases of said waves differ from one another by the amount of $\pm 2/3 \pi$ ($\pm 120°$).

Figure 1:
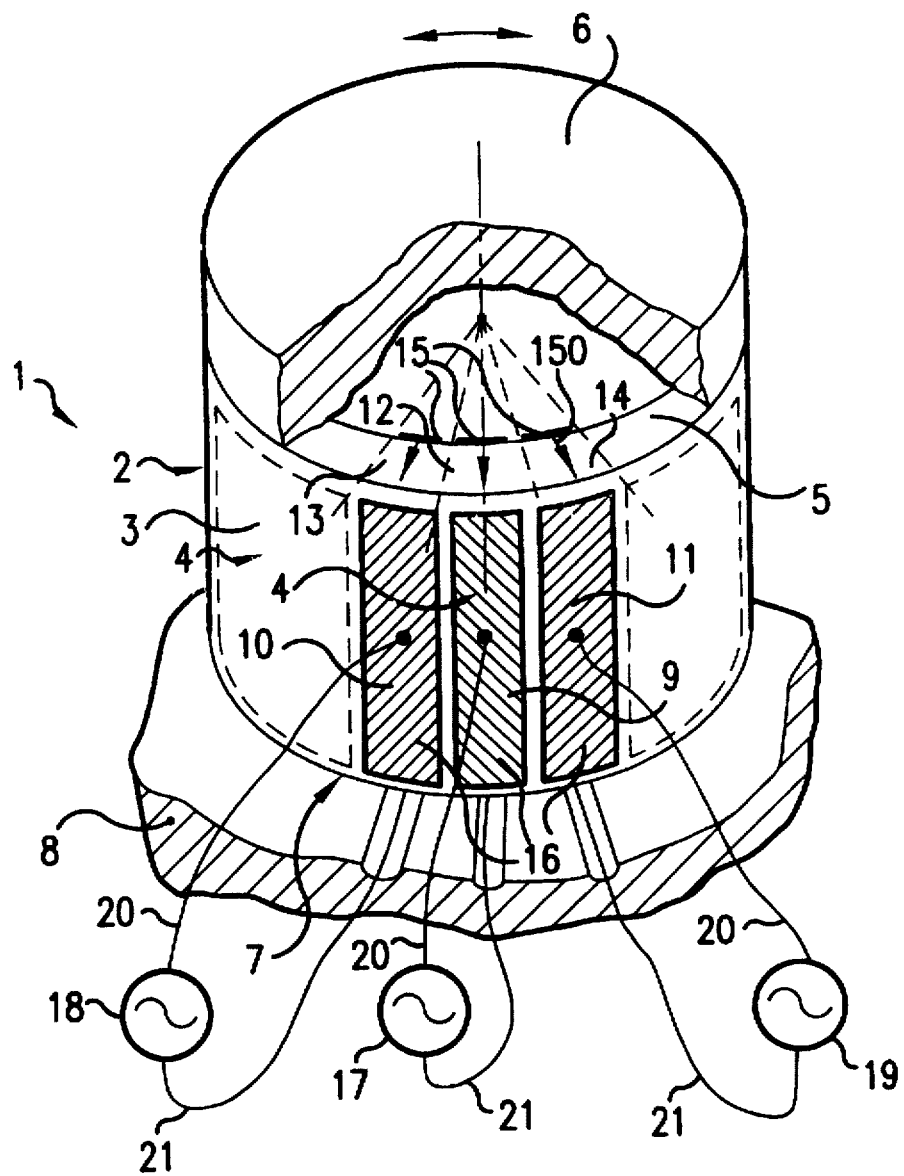
FIG. 1 a perspective view of the substantial components of a motor of the present invention.
Figure 5:
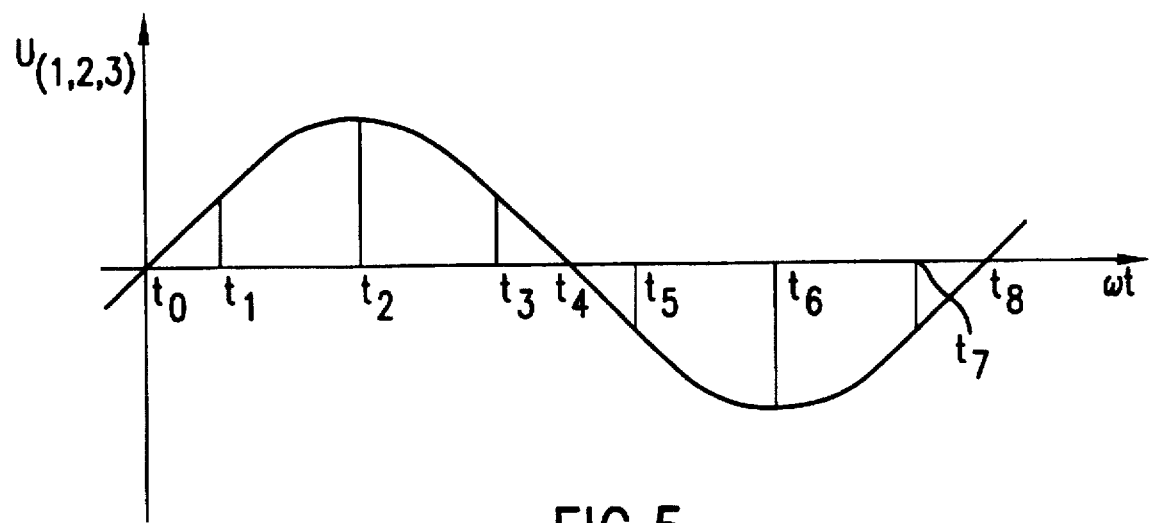

Hereinafter the basic operations of the inventional piezoelectric motor are described in more detail in connection with the FIGS. 1 to 16. Excitation voltages $U_1$, $U_2$, $U_3$, (FIG. 3) supplied from the respective excitation sources 17, 18, 19 are applied across each standing wave generator 9, 10, 11 (FIGS. 1 and 2). Each voltage controls the respective generator 9, 10, 11. Said generators produce in the wave guide 3 of the oscillator 2 three identical longitudinal standing waves of equal amplitude which are, related to the central line 22 of the wave guide 3, spatially shifted to one another by an amount of $\pm \lambda/3$ and, time-dependent (phase) shifted by an angle $\pm 2/3 \pi$ ($\pm 120°$). In FIG. 4 one of said waves is shown. Since the amplitude of oscillation of the oscillator 2 (2–10 μm) is small in relation to its dimensions (20 to 100 mm) each wave is produced independently of one another. They exist independently of one another and deform the operation face 5 of the oscillator 2 independently of one another. The displacement of the points of the oscillator 2 substantially at right angles to the operational face 5 varies in accordance with the sine law due to the action of each individual wave so that the displacement of the points on the operational face 5 follows this law and in accordance with the variation of the sine-shaped excitation voltage. FIG. 5 shows a diagram of the voltage phase of one of the standing wave generators 9, 10, 11 for the given period of time $t_0$–$t_8$ of one oscillating period.

Figure 6:
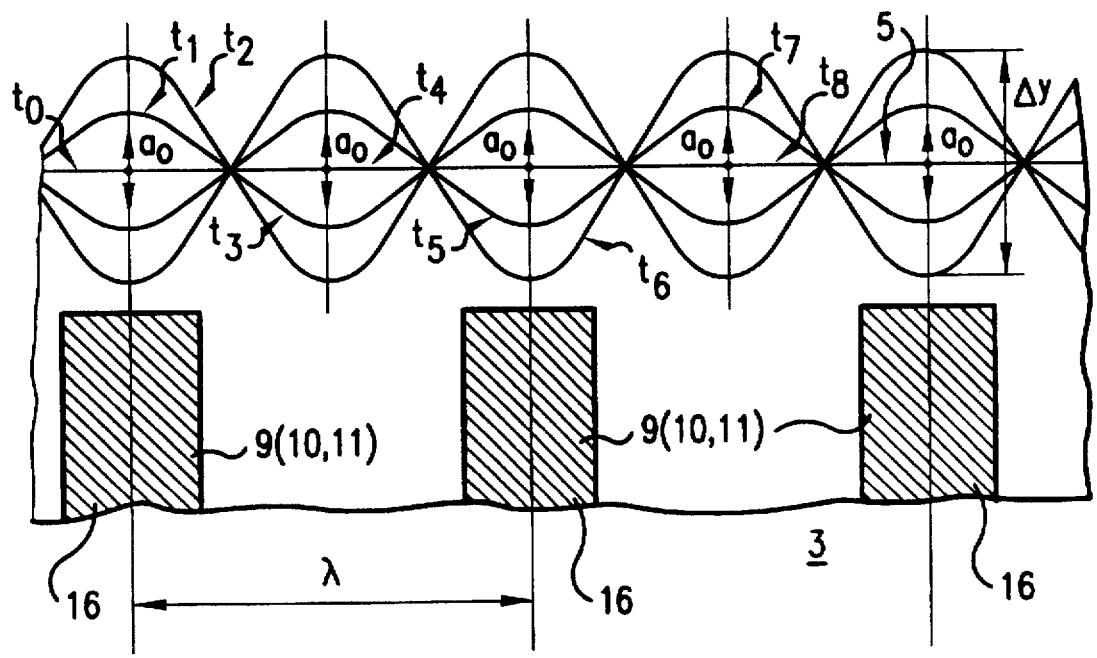

FIG. 6 shows the phases of motion of the operational face 5 of the oscillator 2 for the period of time $t_0$–$t_8$. In the diagram the points $a_0$ of the operational face 5 are indicated which are in the extreme values of the transversal speed of the standing waves. Said points oscillate on straight lines (indicated by dash-points) which are at right angles to the operational face 5. When three standing waves are simultaneously produced in the oscillator 2 then they superimpose. The deformations of the oscillator bulk 2 caused by the standing waves sum up, so do the deformations of the operational face 5.

Figure 7:
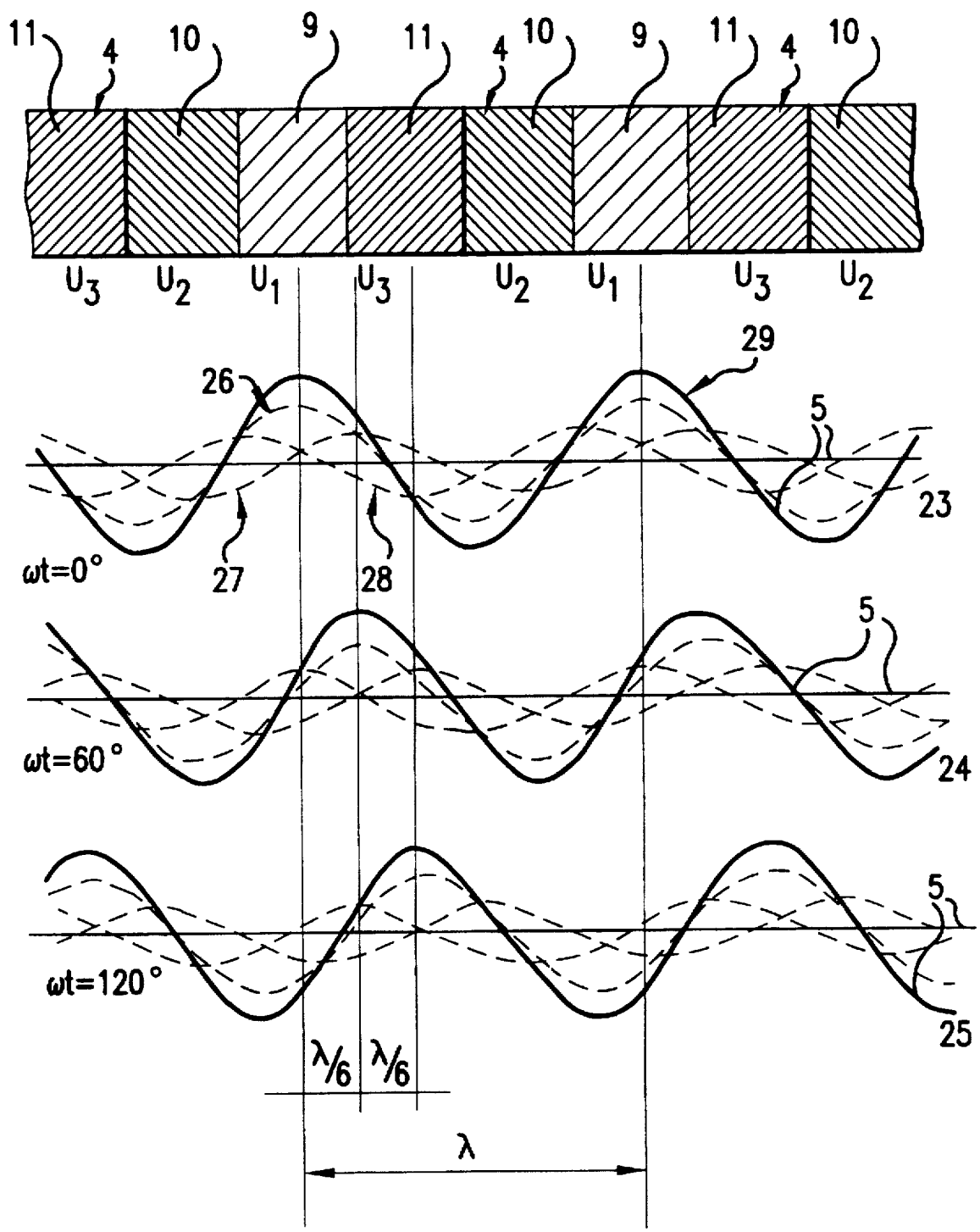

In FIG. 7 the superposition operation for deforming the operational face 5 is shown. The indication of the positions 23, 24, 25 corresponds to the points of time $t_1$, $t_2$, $t_3$ of the instantaneous values of the excitation voltages $U_1$, $U_2$, $U_3$ across the generators 9, 10, 11 (FIG. 3). In FIG. 7 the dashed lines 26, 27, 28 indicate the deformation state of the operational face 5 caused by each standing wave. The solid line 29 characterizes the superimposed deformation of the operational face 5. From the diagrams 23, 24, 25 (FIG. 7) it is visible that the superimposed deformation of the operational face 5 of the oscillator 2 is a travelling wave 29 of the oscillator 2. Said wave travels a path length in one oscillation period which corresponds to the wavelength $\lambda$ of the standing wave. The amplitude of the travelling wave equals the 1.5-fold value of amplitude of one of the standing wives.

Figure 8:
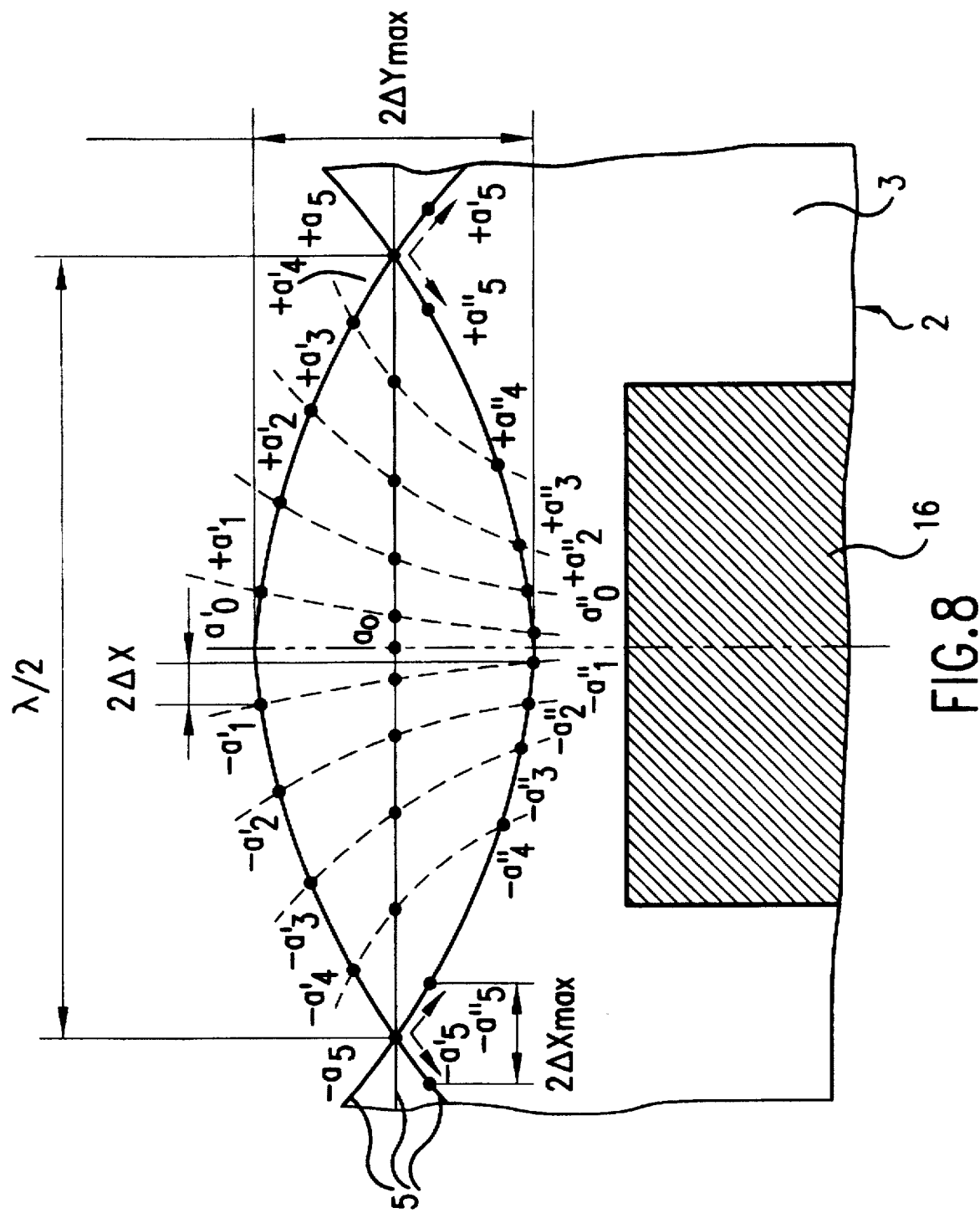

According to FIG. 8 two basicly different schemes of motion are feasible for the points on the operational face 5 of the oscillator 2. In the first case the points $a_0$ to $\pm a_5$ move apart in the peak range when the standing wave bulges, with the operational face 5 expanding, as it were. In the second case the points $a_0$ to $\pm a_5$ as approach one another. The operational face is compressed. The first case may occur when the oscillator 2 is of electromechanical coupling coefficient. The electric field forces between the oscillator electrodes 15, 16 predominantly affect the points of the oscillator 2. In dependence on the size and sign of the excitation field all points of the oscillator 2 depart from or approach one another, the paths of travel of the points being inclined curved lines or closed ellipses.

FIG. 8 shows the complete motion diagram of the points $a_1-a_5$ of the operational face 5 within the wavelength range of the waveguide 3 (oscillator 2) which is $\lambda/2$ when a standing wave is generated in the oscillator 2. The motion lines of the points $a_1-a_5$ (FIG. 8) are indicated by the curved dashed lines. The wave guide 3 (oscillator 2) alternatingly bulges (points $\pm a_1'$ to $\pm a_5'$) and contracts in the oscillation bulge (points $\pm a_1''$ to $\pm a_5''$ 41 ). It is obvious from the course of motion of the points $a_0$ to $a_5$ shown in FIG. 8 that the points $a_0$ in the maxima of the perpendicular oscillation components move on straight lines at right angles to the surface 5. The cylindrical wave guide 3 of the oscillator 2 represents an elastic bulk of finite dimensions, the elementary particles of which are held by one another by force of elasticity. In consequence thereof, when a longitudinal standing wave is excited, the points of the wave guide 3 (oscillator 2) move along inclined paths, as shown in FIG. 8, in the course of which they alternatingly depart from and approach one another. Only those points in the extreme values move (oscillate) on straight paths at right angles to the surface of the cylindrical wave guide 3 (refer to FIGS. 6 and 8). Said points have a maximum transverse amplitude $\Delta y_{max}$. The remaining points travel along paths inclined relative to the surface of the wave guide as shown in FIG. 8. With an increasing distance to the central point $a_0$ their transverse amplitude (along y-direction) is reduced. This explains why each point $a_n$ of the operational face 5 remote from point $a_0$ (line) of the maximum by a certain distance has a transverse and a longitudinal component of speed. With an increasing distance (points $+a_n$ and $-a_n$) on both sides of the central point $a_0$ the longitudinal component (x-direction) of speed increases and, at a distance of $\pm\lambda/4$ the transverse amplitude reaches a maximum value of $\Delta x_{max}$. The transverse componente $\Delta y$ is minimal in this point. The non-linear path of travel (curve) depends on inhomogeneities of the waveguide material at great oscillation amplitudes, what cannot be eliminated in practice.

Figure 9:
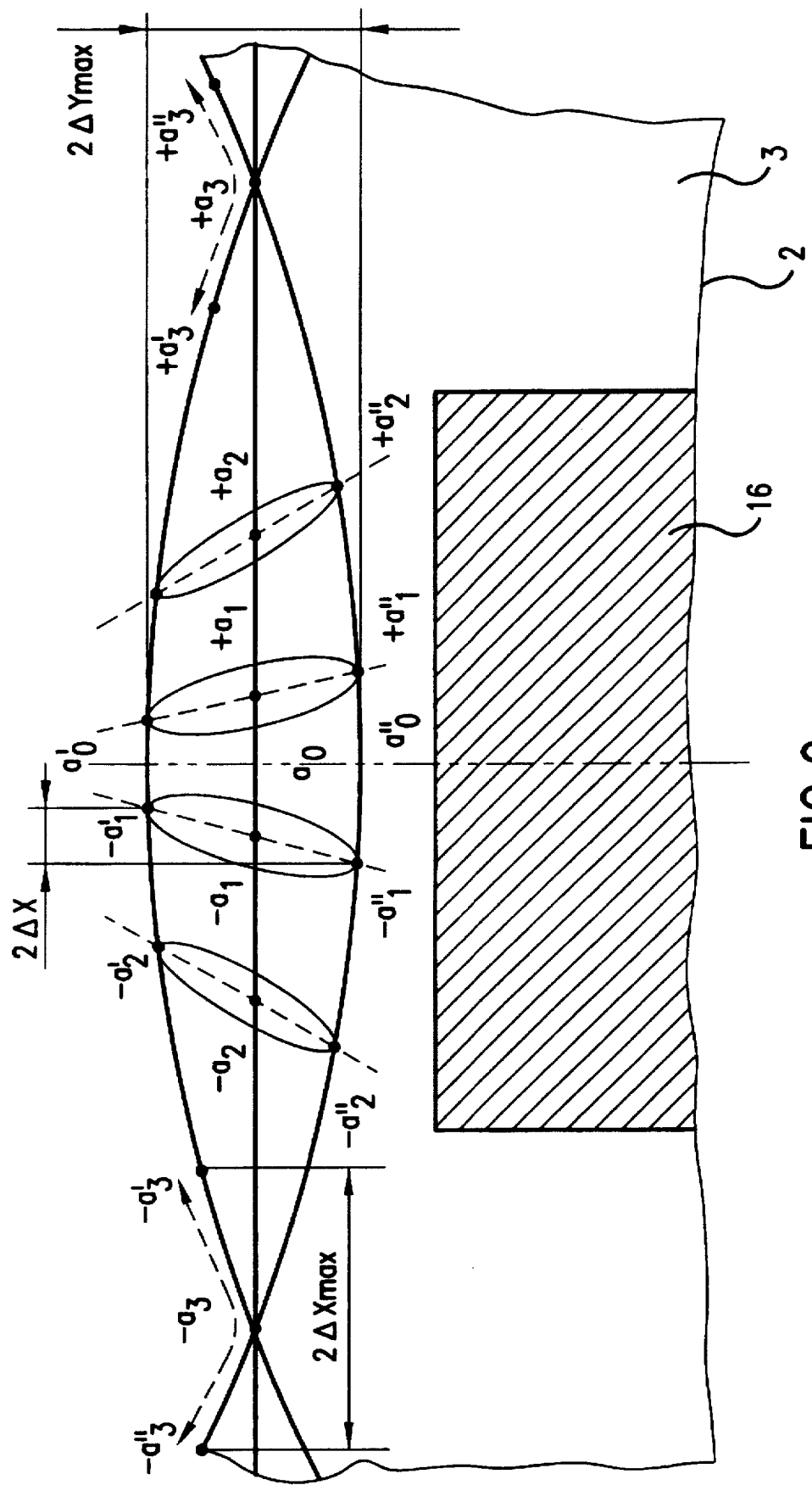

FIG. 9 explains the second case of motion of the points $a_0$ to $\pm a_3$ on the operational face of the oscillator 2. This case may occur at a high mechanical quality of the oscillator 2 and a low electromechanical coupling coefficient of the piezoceramic material of the oscillator 2. In this case the mechanical forces which compress and expand the oscillator bulk due to the motion of the acoustic wave are the main reason for the motion of the points. In practice, the path of travel of the points form similitudes of ellipsoidal figures which are inclined under an angle towards the oscillator surface. Each of the two evaluated cases concerning the motion of the points on the operational face of the oscillator 5 does not vary the operational principle underlying the motor; however, there is a substantial difference as concerns the rotation direction of the rotor 6.

Figure 10:
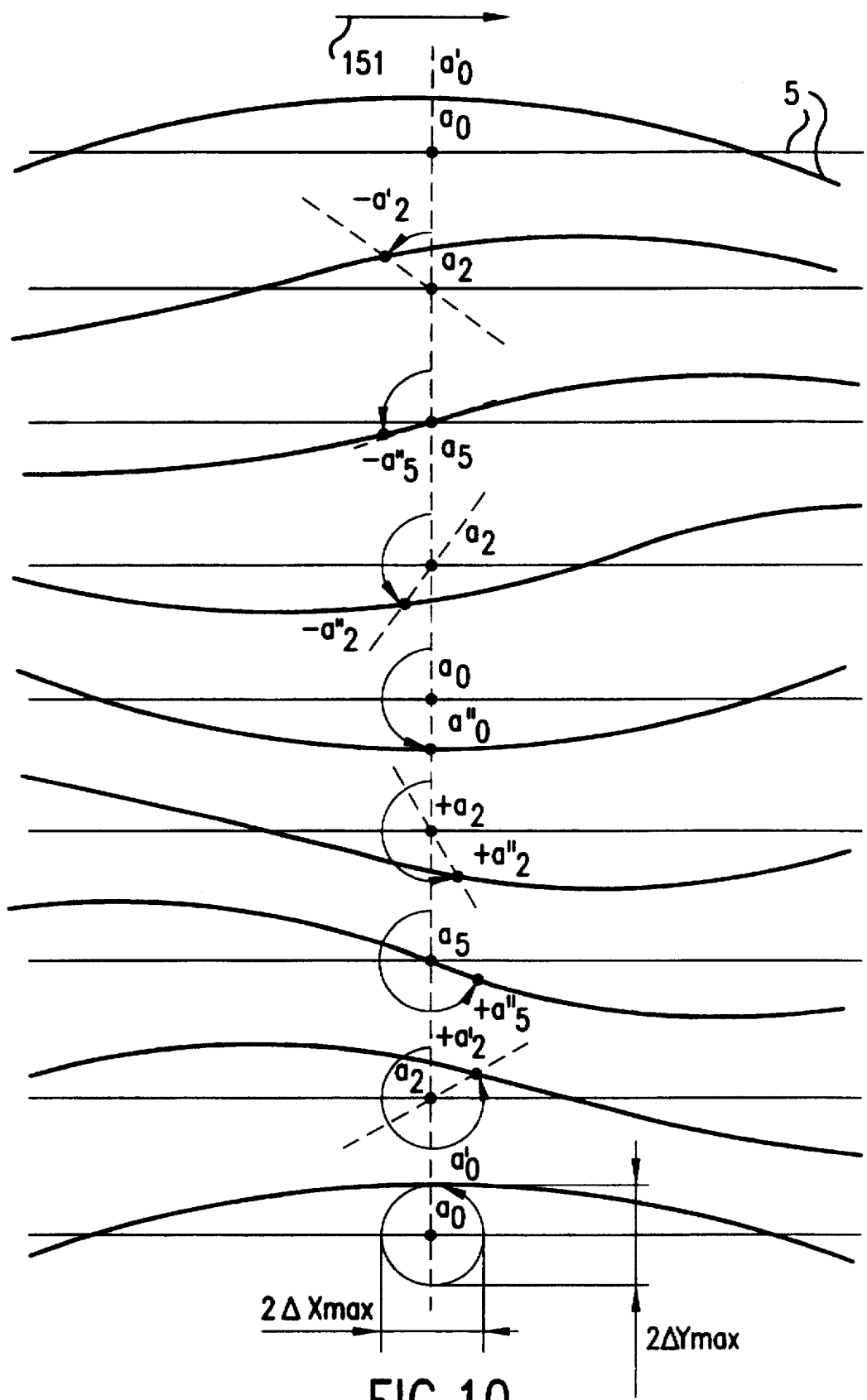
Figure 11:
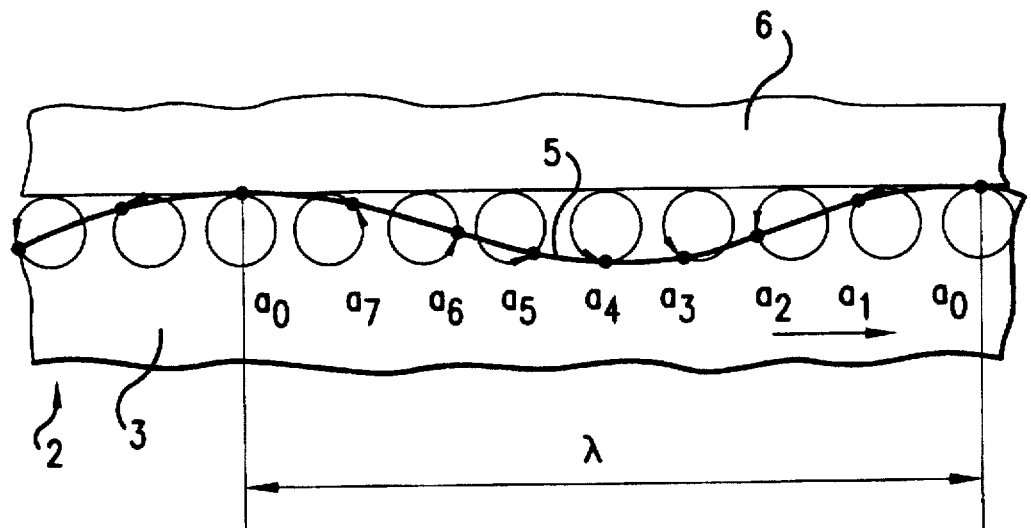
Figure 12A:
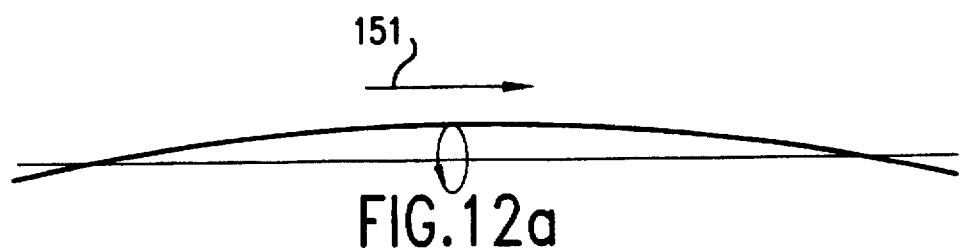
Figure 12B:
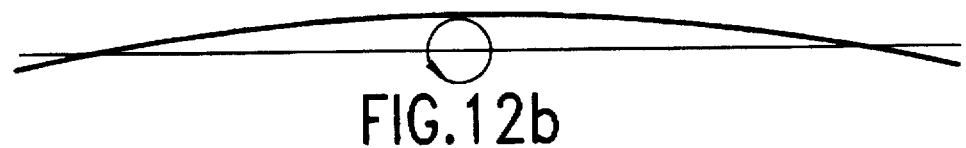
Figure 12C:
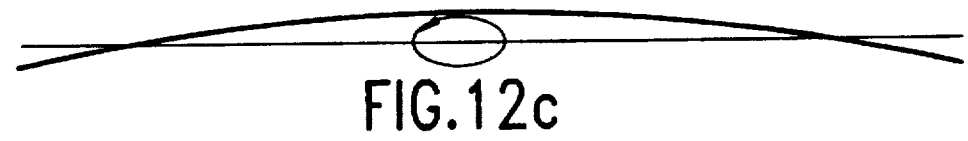
Figure 12D:
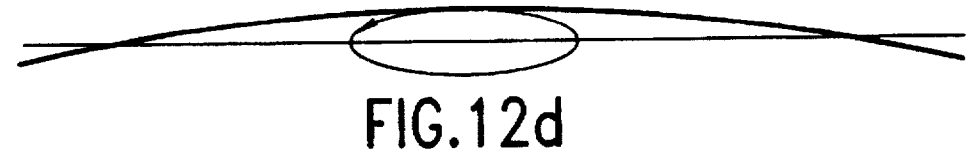
Figure 13A:
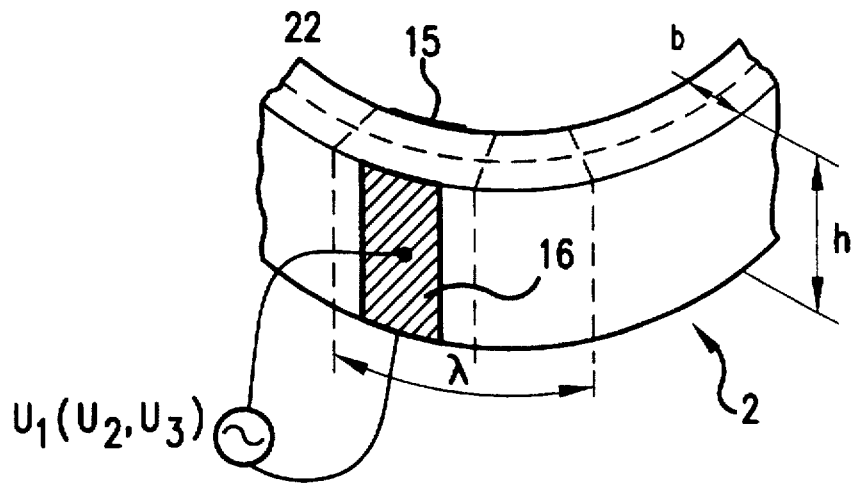
Figure 13B:
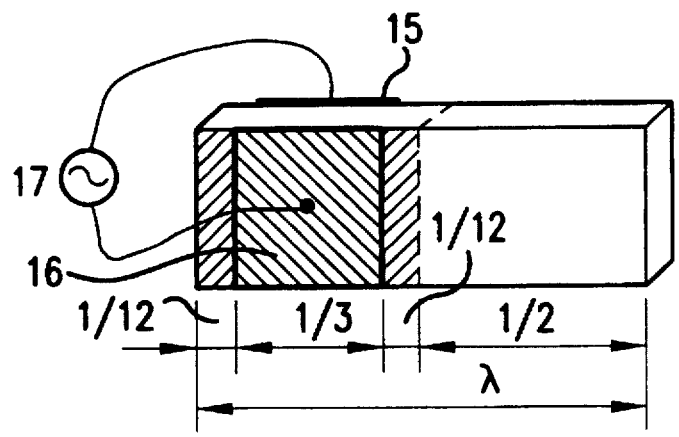
Figure 13C:
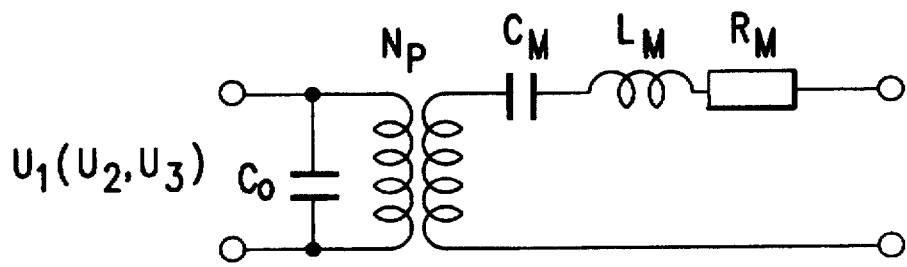

According to FIG. 10, when a travelling wave is generated in the waveguide 3 of the oscillator 2, each point on the operational face 5 of the oscillator 2 subsequently passes the positions of the entire points from $+a_n'$ to $-a_n'$ and from $-a_n''$ to $+a_n''$, while travelling along a closed path which generally is an ellipse and, in a special case, a circle. The direction of travel of the wave is indicated by an arrow 151. The maximum height of the ellipse equals double the maximum transverse amplitude $\Delta y_{max}$. The maximum width of the ellipse is double the maximum longitudinal amplitude $\Delta x_{max}$. The phase angle included by the longitudinal and transverse component always is 90°. Provided that the transverse component $\Delta y$ equals zero the maximum longitudinal component $\Delta x$ obtains a maximum, and when the longitudinal component $\Delta x$ is a maximum the transverse component $\Delta y$ substantially is zero. Each point $a_n$ has a course of motion on its elliptical path differing from that of point $a_n \pm 1$. FIG. 11 represents the course of motion of points $a_0$ to $a_7$ on the operational face 5. It can be seen that the points $a_0$ which are, at the point of time given, on a wave peak contact the rotor 6. Due to the friction force said points of the operational face 5 convey a torsion moment to the rotor 6. The rotor material exhibits a certain constant plasticity so that said contact, in practice, is a surface contact, the contacting face depending on the elastic properties of the material of the rotor and on the resilient force which presses the rotor 6 to the operational face 5 of the oscillator 2. As it were, a certain number of points on the wave peak of the travelling wave are in contact with the rotor to transmit a torsion moment to the latter, the points in the wave troughs moving in a reverse direction. During one oscillation period each point of the operational face 5 entirely passes its path of travel. The number of surface portions of the operational face 5 contacting the rotor 6 equals the number of wavelengths $\lambda$ corresponding to the length of the central line 22 of the oscillator 2 (FIG. 13). The rotation direction of the ellipses or the direction of travel of the points in contact to the rotor 6 depends on whether or not the points in the peaks of the standing wave at the point of time of expansion of the oscillator material (FIGS. 8 and 9) depart from or approach one another. When the points depart from one another the ellipses and the rotor 6 rotate in reverse direction with respect to the propagation direction of the travelling wave. When the points approach one another the rotation direction of the ellipses and the rotor 6 coincides with the propagation direction of tile travelling wave. Said case is not considered here. The relation $\Delta x/\Delta y$ between the longitudinal and transverse component, i.e. the course of motion of the motor is substantially defined by the ratio of the wavelength $\lambda$ to the height h of the waveguide. The greater said ratio is the more the ellipses are expanded along the operational face 5. The smaller said ratio is the more the path of travel of points approaches a circular path. The width of the oscillator (wave guide) and the elasticity properties of the oscillator material are of low influence on the ratio of the components $\Delta x/\Delta y$. With motors in which the path of travel of the points of the operational face 5 approximates a circular shape the ratio of wavelength $\lambda$ to the height of oscillator h is about 2. FIGS. 12a–12d show feasible paths of travel of points on the operational face 5, namely, FIG. 12a shows an oblong ellipse at right angles to the operation face 5, FIG. 12b shows a circular path of travel, FIG. 12c shows an oblong ellipse of an axial ratio of 1.5 extending along the operational face 5, and FIG. 12d shows an ellipse having an axial ratio of 4. A path of travel in shape of an oblong ellipse extending along the operational face 5 and having a ratio of components within the range of 2 to 5, FIGS. 12c and 12d, is optimal as concerns operation of the motor. In this case the energy flow directed tangentially to the operational face 5 is four to twenty-five times greater than that directed at right angles relative to said face; that is, the greater portion of stator energy potentially is converted into rotor energy. The circular path of travel in FIG. 12b is a critical case. As concerns the oblong ellipse extending at right angles to the operational face 5, FIG. 12a, the main portion of energy of the stator 2 enters into the rotor 6 of the motor, excites the latter and is converted there into heat. That is the reason why such a path of travel is undesired. In the case of an extremely oblong ellipse (not shown) extending along the operational face 5 the energy directed at right angles to the rotor face would not suffice to establish a friction contact between oscillator 2 and rotor 6. With such motors a large portion of energy would be released, inter alia, from the oscillator 2 as heat. Accordingly, the oscillator 2 of the motor has an optimum geometry which is determined by the path of travel of the points. Said geometry is determined by the ratio from the length of the standing wave $\lambda$ generated to the height h of the oscillator 2 (waveguide 3). The exact value for the optimum ratio depends on the elasticity properties of the oscillator 2 material and from its width b and lies within a range of from $\lambda$ to 0.25 $\lambda$. Independently from one another the standing wave generators 9, 10, 11 in the oscillator 3 generate acoustic standing waves so that said generators can be considered as an independent electromechanical oscillation system. Therefore it is feasible to select an elementary volume of a length $\lambda$ for each generator 9, 10, 11 on the oscillator 2 including a standing wave generator as shown in FIG. 13a. Such a volume can be considered as an elementary independent oscillation system of the length $\lambda$ with electrodes of the length $\lambda/2$, i.e., as a two-mode piezoelectric resonator as shown in FIG. 13b. The equivalent electric circuit of such a resonator is shown in FIG. 13c. The circuit comprises the following components:

a static capacity $C_o = s/b \cdot \epsilon_{33}^T (1-K_{31}^2)$, wherein s is the area of the electrodes.

an ideal electromechanical transducer having a transducer coefficient of $N_p = b/2 \cdot d_{31}/S_{11}^E$ a mechanical capacity $C_M = \lambda/\pi^2 \cdot S_{11}^E/b \cdot h$ a mechanical inductivity $L_M = m$, wherein m is the mass of the elementary volume, a resistor for the mechanical oscillator losses $R_M = \omega L_M / \theta_{e.G.}$, wherein $\theta_{e.G}$ is the effective quality of the motor.

The complete equivalent circuit of a transducer generator 4 can be considered as a unit of three identical equivalent circuits 37, 38, 39 (FIG. 14) of the standing wave generators 9, 10, 11. In the complete circuit each of the equivalent circuits 37, 38, 39 is connected to the respective excitation source 17, 18, 19. The output of each equivalent circuits 37, 38, 39 is connected to the friction transducer 40. The friction transducer 40 given in the complete equivalent circuit reflects the friction contact of the piezoelectric motor. It comprises a resistance for the friction losses $R_F$ and an ideal transducer for transducing the oscillations of the oscillator 2 into a rotational motion of the rotor 6, wherein $N_F = M/F_-$, M=constant torsion moment, $F_-$=a variable force, is valid for the transducing coefficient.

The output of the friction transducer 40 is connected to the resistance of the mechanical load $R_L$.

Figure 14:
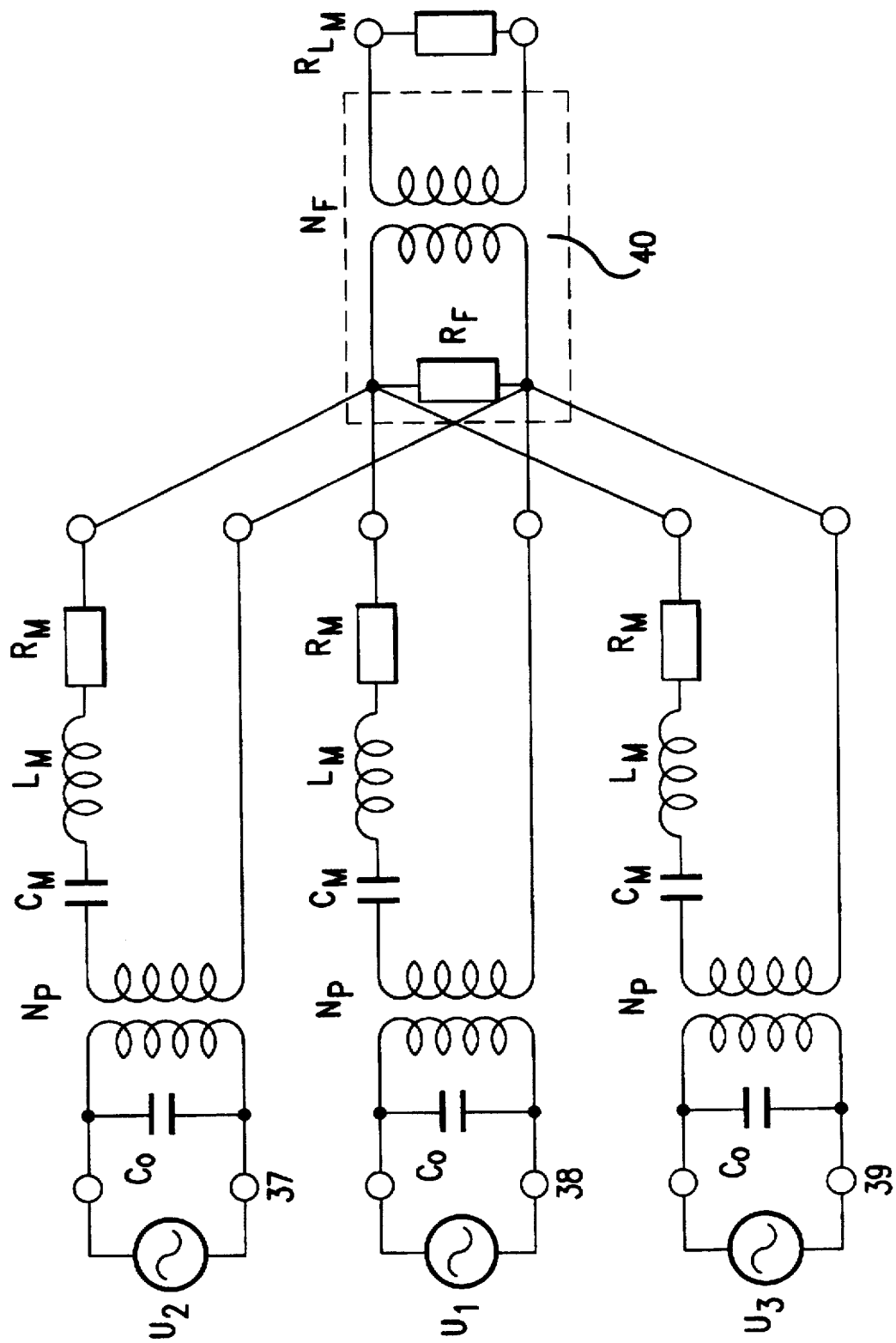
Figure 15:
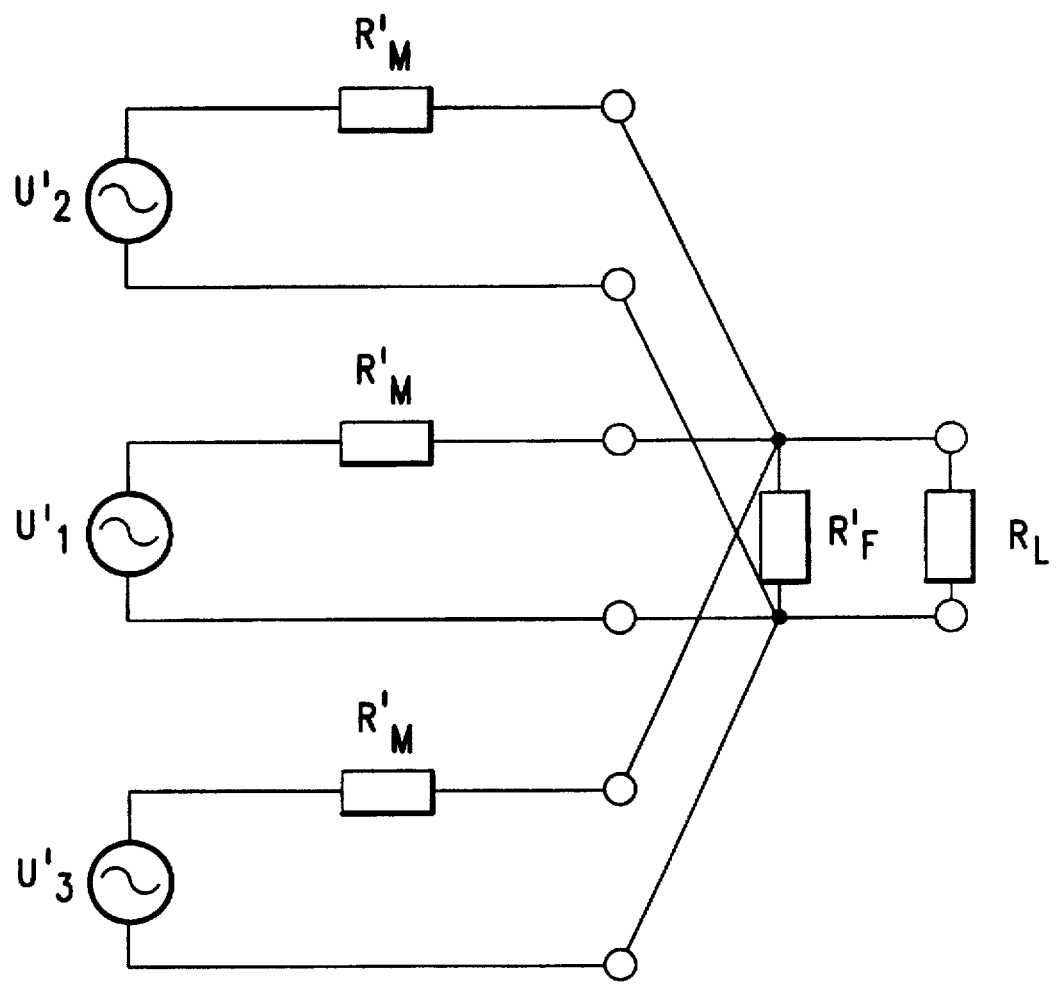
Figure 16A:
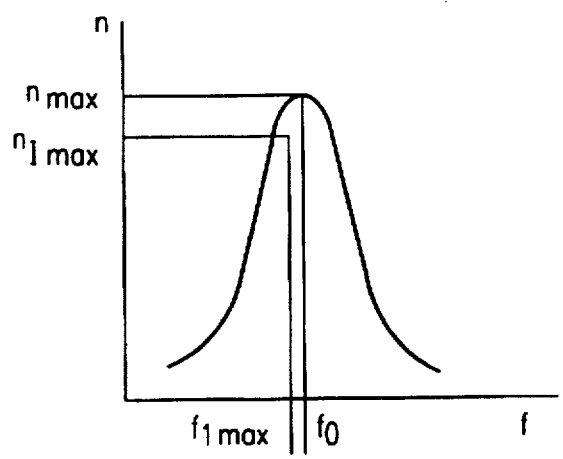
Figure 16D:
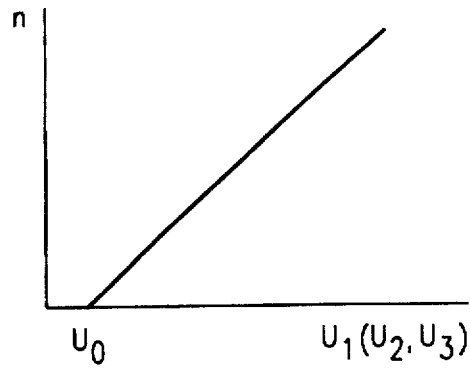
Figure 16B:
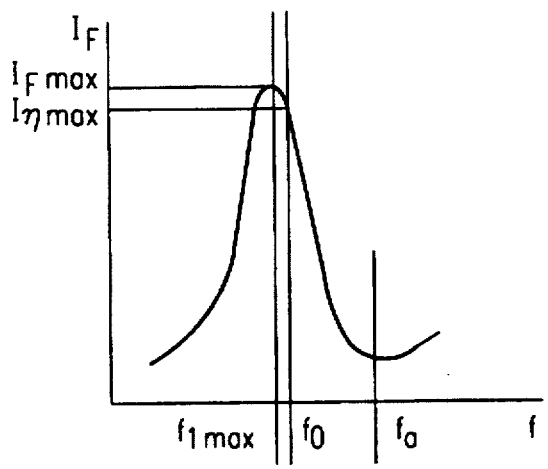
Figure 16E:
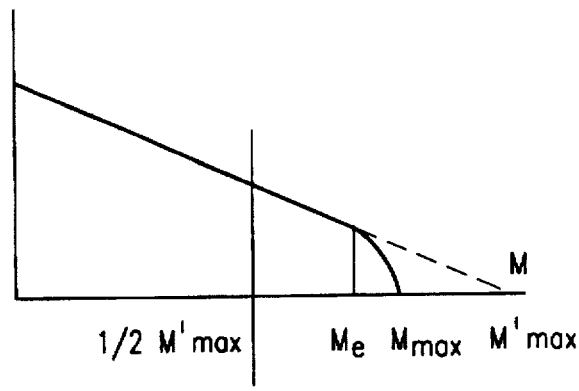
Figure 16C:
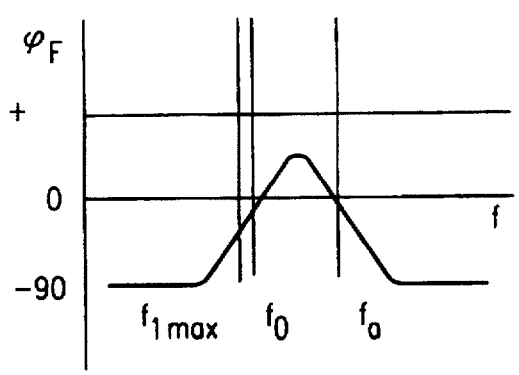
Figure 16F:
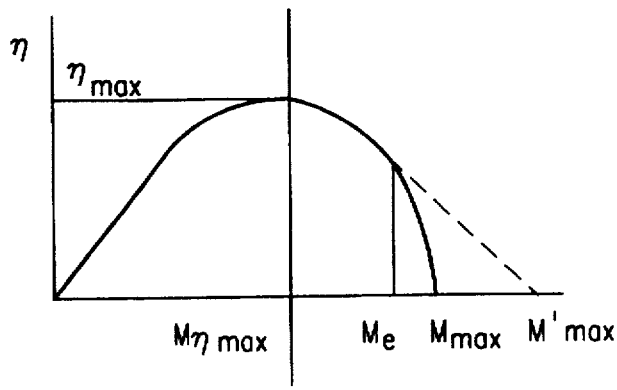

The equivalent circuit shown in FIG. 14 can be reduced into a simpler one as shown in FIG. 15, provided that the piezoelectric motor operates at the mechanical resonant frequency of the oscillator 2. In said equivalent circuit the parameters $U_1'$, $U_2'$, $U_3'$, $R_M'$, $R_F'$, are transferred to the mechanical part of the circuit according to FIG. 14. The motor exhibits the conventional electromechanic properties of piezoelectric motors. In practice the resistor $R_M$ for the mechanical losses in the oscillator generally is considerably smaller than the impedance $\omega L_M$ of the oscillator 5. Accordingly, the frequency dependence of the motor exhibits characteristics shown in FIG. 16a–16c. FIG. 16a shows the rotation frequency n as a function of the excitation frequency f. FIG. 16b shows the phase current $I_F$ (current of one of the standing wave generators 9, 10, 11) as a function of the excitation frequency f, and FIG. 16c shows the phase shift $\phi$ as a function of the excitation voltage $U_1$ ($U_2$, $U_3$) and of the phase current $I_F$. All characteristic curves of FIGS. 16a–16c are interconnected via typical points. Hence, the maximum of the rotation frequency $n_{max}$ corresponds to the mechanical resonant frequency of the oscillator $f_0(\omega_0)$. Said frequency is indicative of a zero-phase shift between the input voltage $U_1$ ($U_2$, $U_3$) and the input current $I_F$ of each of the phases as shown in FIG. 16c. The maximum current $I_{Fmax}$ lies at the frequency $f_{Imax}$ left from the mechanical resonant frequency $f_0$. The current function 42 has a second zero phase at the anti-resonant frequency $f_a$ of the oscillator 6. The phase shift between the input voltages $U_1$ ($U_2$, $U_3$) and the phase current $I_F$ (43) is positive in the range of from $f_0$ to $f_a$. It is negative in the remaining ranges of the excitation frequency. All three functions are continuous ones, that is, there are no ranges of non-defined states. FIG. 16d, plots a function of the control voltage, i.e. the dependence of the rotation frequency n on the level of the excitation voltage $U_1$ ($U_2$, $U_3$) when the motor operates at the mechanic resonant frequency $f_0$. This function is substantially linear with a small discontinuity at the voltage $U_0$ when the transverse amplitude of the oscillations of the oscillator 2 is smaller than the roughness of the operational face 5. FIG. 16e mechanical characteristic values of the motor are plotted, the dependence of the rotation frequency n on the load moment M when the motor operates at the mechanical resonant frequency is shown. The function is linear up to the load moment $M_e$. At said moment the friction contact breaks off. In the load range of from $M_e$ to $M_{max}$ the motor operates discontinuously. The dashed line indicates the possible maximum value of the load moment $M'_{max}$. This value is attainable at an ideal selection of material for the friction coupling of stator 1 and rotor. FIG. 16f shows the quality diagram of the motor, that is, the dependence of the efficiency factor $\eta$ on the load moment M when the motor operates at the mechanical resonant frequency $f_0$. The function follows a parabolic curve up to the load value $M_e$. The maximum $M_{\eta max}$ lies in the vicinity of half the possible maximum load moment $\frac{1}{2}M'_{max}$. The size of the maximum efficiency coefficient $\eta_{max}$ depends on the relation between the loss resistance $R'_M$ of the oscillator and the loss resistance of the friction contact $R'_F$. In a physical realization the loss resistance of the friction contact $R'_F$ is always greater than the loss resistance of the oscillator $R'_M$. Hence, the motor has a sufficiently great efficiency which lies in a range of from 30% to 70%.

Figure 17A:
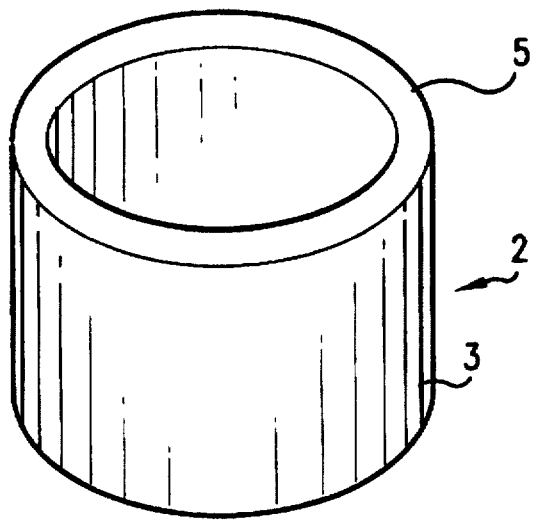
Figure 17B:
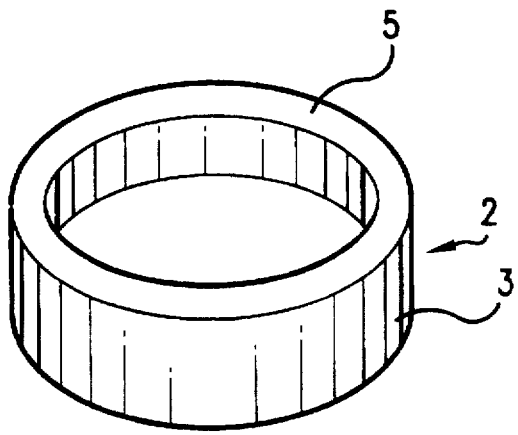
Figure 17C:
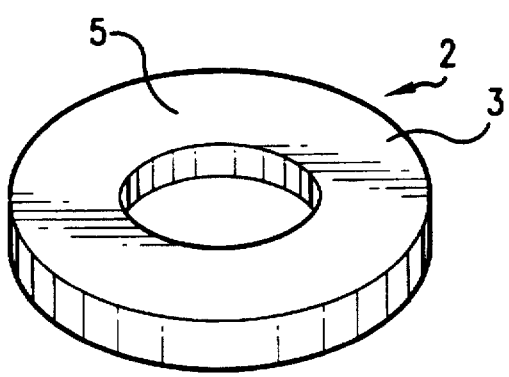
Figure 17D:
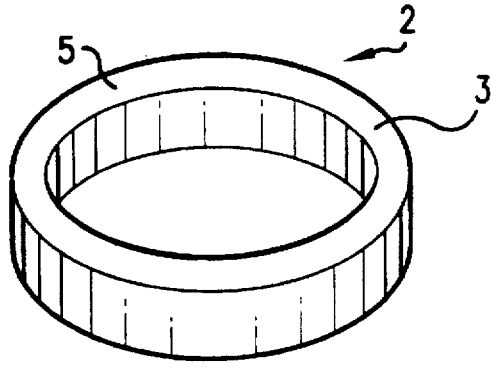
Figure 17E:
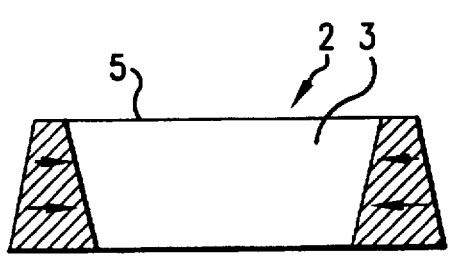
Figure 17F:
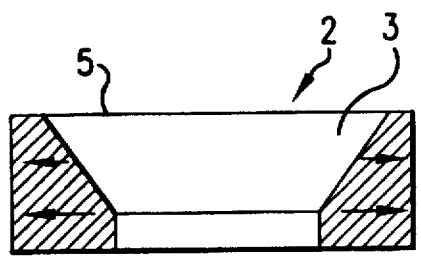
Figure 17G:
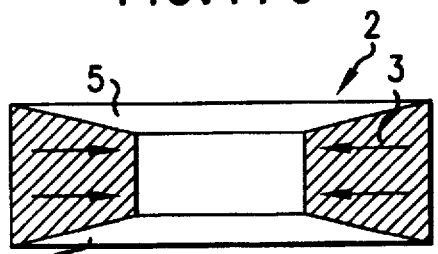
Figure 17H:
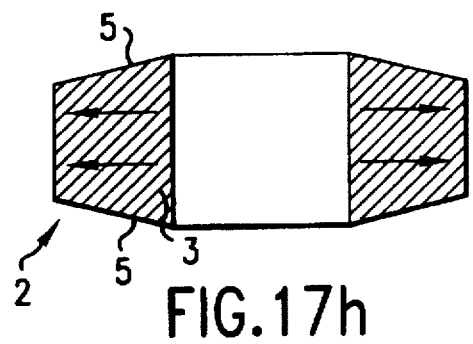

FIG. 17a–17h shows modifications of monolithic oscillators 2 of the motor entirely manufactured of piezoceramics. Said oscillators are the waveguides for the travelling waves produced in the generator 4. Each of the shown modifications can be employed in dependence on the physical constructions and the required motor parameters. Accordingly, the oscillator 2, in FIG. 17a for example, embodied as an oblong cylinder the height of which is greater than or equal to its diameter, permits the construction of piezoelectric motors of minimum dimensions including a travelling wave generator 4 (FIG. 1). The oscillator 2 embodied as a short broad cylinder, in FIG. 17b, is employed when a maximum mechanical output is required. In this case the diameter of the oscillator 2 can be extended at will, the number of travelling wave generators 4 and, accordingly, the number of waves contacting the rotor 6 is increased. A disk-shaped oscillator in FIG. 17c, which also can be considered as a cylinder, can be employed as a flat motor of minimum height. When a piezoelectric motor of minimum cross-section and a central opening is required, an annular, shown in FIG. 17d oscillator is employed The use of an oscillator of conical cross-section, shown in FIGS. 17e and 17f, permits a multiplication of the oscillation speed. Such oscillators work in analogy to concentrators for mechanical tensions which multiply the oscillation speed in a narrow range of their cross-section. The use of multiplying concentrators permits a 1.5-fold to a twofold increase of the oscillation speed and, hence, of the rotation frequency of the rotor. FIGS. 17g and 17h shows oscillators having conical operational faces 5. Such oscillators permit the construction of piezoelectric motors without centering ball-bearings which considerably reduces the costs of the motors. Since the conical operational face 5 of the oscillator 2 is a large one the mechanical output of the motor is enhanced in relation thereto.

The piezoelectric motor is based upon a friction contact of the oscillator 2 to the rotor 6, i.e. the faces acting one upon the other are subject to a friction wear. The degree of wear of said faces determines the mean time between failure of the motor which, in turn, depends on the wear resistance of the materials used for the friction coupling constituted of the operational face 5 of the oscillator 2 and the surface of the rotor 6. The selection of the rotor material is no particular problem. It can be selected both, from very hard materials such as ceramics based on alumina, zirconium oxide, titanium carbide, tungsten carbide, thermally treated alloy steel and the like, and from soft composite friction materials on the base of thermally reactive plastic materials including solid fillers. The selection of the oscillator material is more difficult since the oscillator has to be manufactured from piezoactive material. Only a limited number of piezoactive materials can be directly used. Such are quartz, some crystallites, and barium titanate. Quartz has a very small piezoelectric module which limits its use. Barium titanate has a low Curie-point which opposes its use over a wide temperature range. The problem of having available a wide scope of piezoceramics has been solved in that the operational face 5 of the oscillator 2 is provided with a thin wear-resistant layer which resists the frictional wear of the oscillator 2 and determines the friction coefficient of the operational face 5 at the same time. The material of friction layer 5 has to satisfy the following conditions: it has to be resistant to the friction wear due to the friction effect oscillator-rotor motor; it has to form a stable, for example, chemical compound with the piezoceramics. Additionally, it has to be resistant against strong ultra-sonic fields.

In FIGS. 18a–18e a number of modifications of a wear resistant layer 60 for the piezoelectric motor is shown.

Figure 18A:
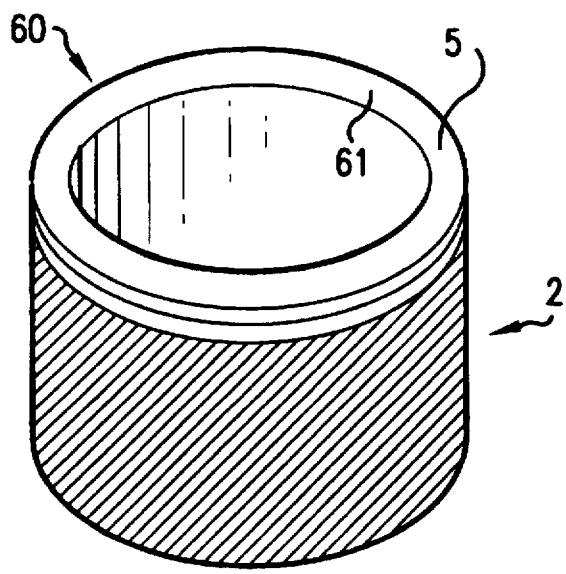
Figure 18B:
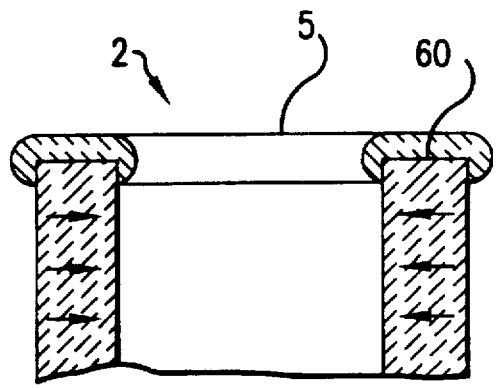

According to FIG. 18a, the wear resisting layer can be a ring 61 made of a 0.1 to 0.3 mm thin oxide ceramics (based on alumina or another material), which is cemented to the piezoelectric oscillator 2 by means of a material which forms a chemical compound with the oxide ceramics and the piezoceramics, for example, glass. Such a glass has to contain a sufficient amount of lead oxide. In FIG. 18b a modification of a wear-resisting layer 60 is represented which, in the present case, is a thin layer of hardened and wear resisting glass applied to the operational face 5 of the oscillator 2. The glass is applied to the the oscillator 2 before being polarized. In order to avoid splintering when cooling down the glass has to be selected based on temperature coefficient of expansion in such a manner that it does not differ from that of the piezoceramics by more than 5%. Such layers are employed in motors of low power.

Figure 18C:
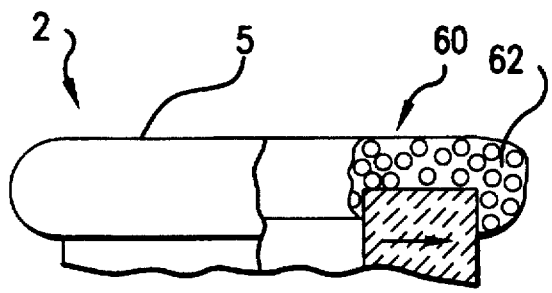

The use of a friction layer of pure glass is disadvantageous due to the very low friction coefficient. It is feasible to treat the glass with a powder 62 made of an abrasive material as shown in FIG. 18c to increase the friction coefficient. Powders of alumina, titanium carbide, titanium nitride or the like can be employed as abrasive fillers. Such an embodiment permits a precise selection of the wave resistance of the friction layer 60 which renders them non-discernible to ultra-sonic waves, i.e. the reliability of the compound is increased and, hence, the output of the motor.

Particular stable friction layers for piezoceramic stepping power motors can be manufactured from porous oxide ceramics filled with a material which forms a compound with the piezoceramics of the oscillator 2. Such a friction layer 60 is shown FIG. 18d. A porous alumina ceramics is best suited for that, the pores of which are filled with an easily melting glass material forming a chemical compound with the piezoceramics of the oscillator 2.

Figure 18E:
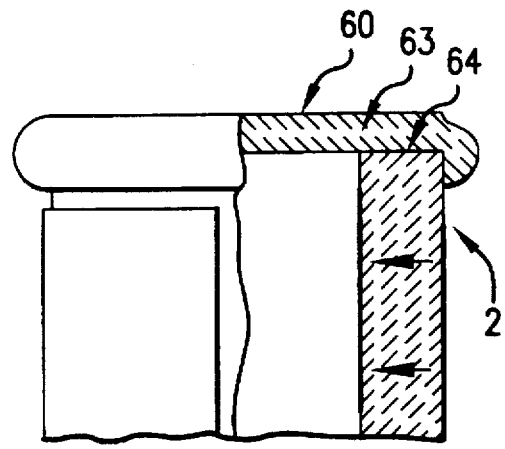
Figure 18D:
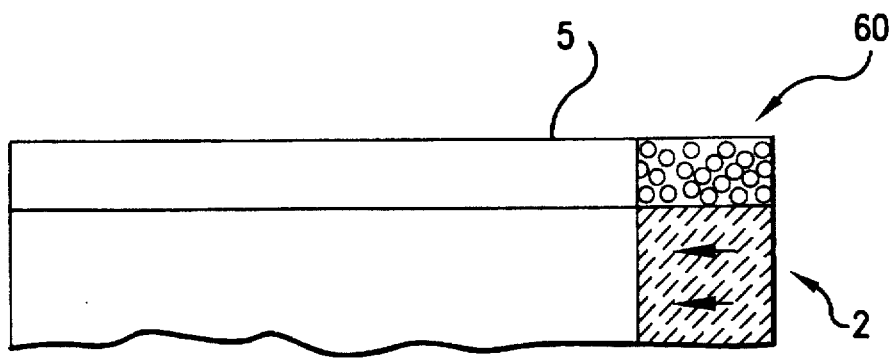
Figure 19A:
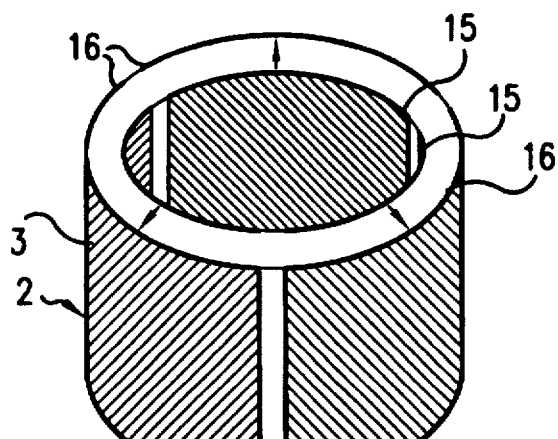
FIGS. 19a–19e are different electrode modifications, FIG. 20 a special electrode arrangement, FIG. 21 a nonsymmetrical travelling wave, FIG. 22 block diagrams to explain the basic principle underlying the oscillator control, FIG. 23 an oscillator comprising two independent generators and one generator depending on the latter, FIG. 24 an equivalent electric circuit of the generators of FIG. 23, FIG. 25 a block diagram for oscillator self-excitation, FIG. 26 a block diagram including a frequency controlled autogenerator, FIG. 27 a block diagram of an electromechanical autogenerator arrangement, FIG. 28 a block diagram of a current transformer, FIG. 29 a feedback electrode and its operating mode, FIG. 30 a block diagram including a feedback electrode, FIG. 31 a block diagram of a step motor, FIG. 32 a longitudinal section of a motor design including an oblong oscillator, FIG. 33 a top view of the oscillator of FIG. 32, FIG. 34 a motor design including an annular oscillator, FIG. 35 a sectional view of a motor design in a clamp housing, FIG. 36 a partially plan view, partially sectional view of the motor design of FIG. 35, FIG. 37 a motor design including packet transducers in an axial section of FIG. 38 along the axis XXXVII—XXXVII, FIG. 38 a plan view of FIG. 37, FIG. 39 an axial section of a motor design comprising an annular magnet, FIG. 40 a basic circuit diagram including an frequency-controlled autogenerator, FIG. 41 a first motor circuitry employed as electromechanical autogenerator, FIG. 42 a second motor circuitry employed as electromechanical autogenerator, FIG. 43 a basic circuit diagram of the motor of the present invention employed as a step-motor, and FIG. 44 a basic circuit diagram of a motor including two independent generators and one generator depending on the latter.
Figure 19B:
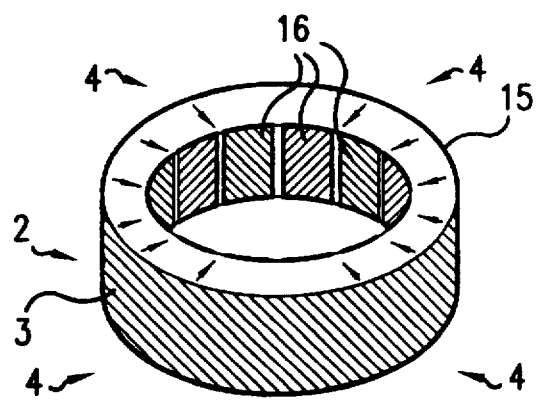
Figure 19C:
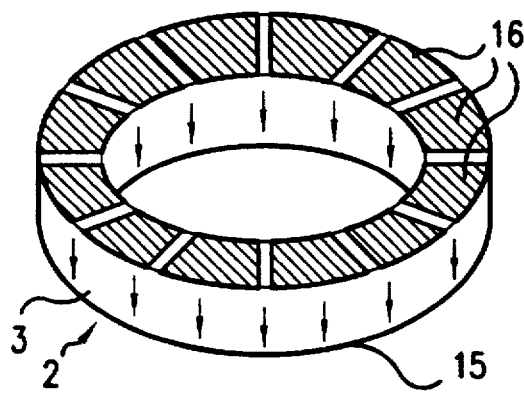
Figure 19D:
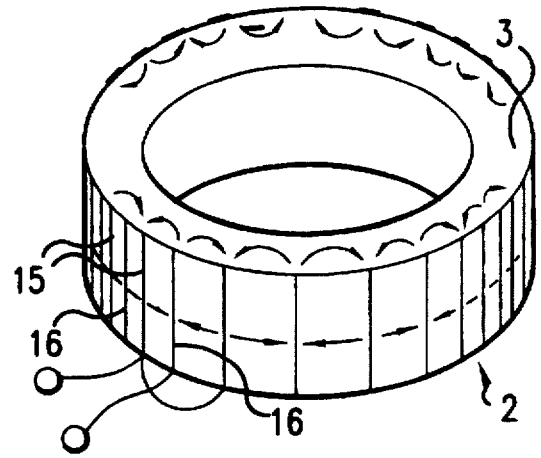

In FIG. 18e a modification of the friction layer 60 is represented as a double layer structure constituted of a base layer 63 and an intermediate layer 64. In this embodiment the base layer determines the friction properties of the operational face 5, the intermediate layer 64 forming a stable connection between the piezoceramics and the oscillator 2. It is technologically reasonable to apply the intermediate layer 64 as a metal layer simultaneously forming the structure of the electrodes 15, 16 of the oscillator 2. It is feasible to produce such a coat by chemically precipitating nickel, by sputtering nickel, tantalum or any other material by means of ion implantation. The base layer 63 of chrome or any stable material can be applied to the intermediate layer 64 in the range of the friction contact by means of a chemical or electrochemical procedure. The present invention can also use any suitable method for formation of the friction layer 60. Each embodiment of the oscillator 2 for the piezoelectric motor comprises a number of travelling wave generators 4 which substantially occupy its entire volume. Said generators determine the structure of the electrodes 15, 16 on the surface of the wave guide 3 of the oscillator 2. FIGS. 19a–19e shows the most important embodiments of the electrodes 15, 16. In FIGS. 19a an oscillator 2 is shown comprising a generator 4 and three groups of electrodes 15, 16. Each of said groups of electrodes constitutes a standing wave generator 9, 10, 11 (FIG. 1). FIG. 19b shows an oscillator as a short cylinder. Said oscillator has four travelling wave generators 4. The entire electrodes 15 of said oscillator constitute a common electrode one the outside. The single electrodes 16 are provided on the internal face of the oscillator 2. In FIG. 19c, the oscillator 2 is of annular shape with the electrodes 15, 16 arranged on the plane faces. The FIG. 19d shows an embodiment of the oscillator 2 in which the stripe-shaped electrodes 15, 16 are arranged on the external face. Such an oscillator 2 has a longitudinally polarized wave guide 3 face and can be employed when the oscillator is excited by high voltages. In this embodiment the oscillator 2 has no electrodes on its internal face. The entire electrodes 16 of said oscillator 2 are connected in parallel and constitute the common electrodes of the standing wave generators 9, 10, 11. Accordingly, each of the electrodes 15 is coordinated to a respective generator 9, 10, 11.

Figure 19E:
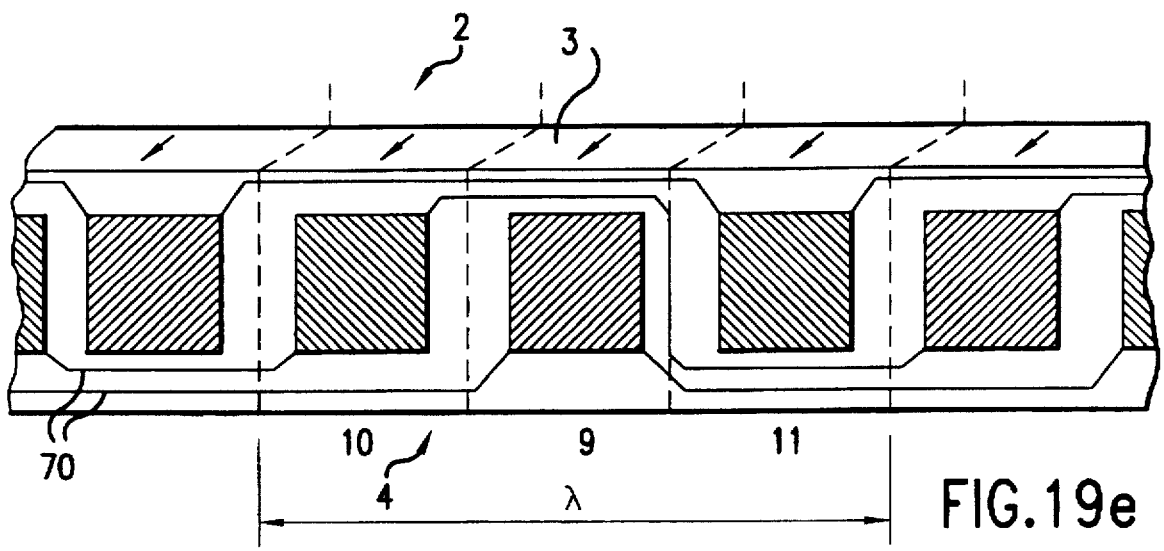
Figure 20:
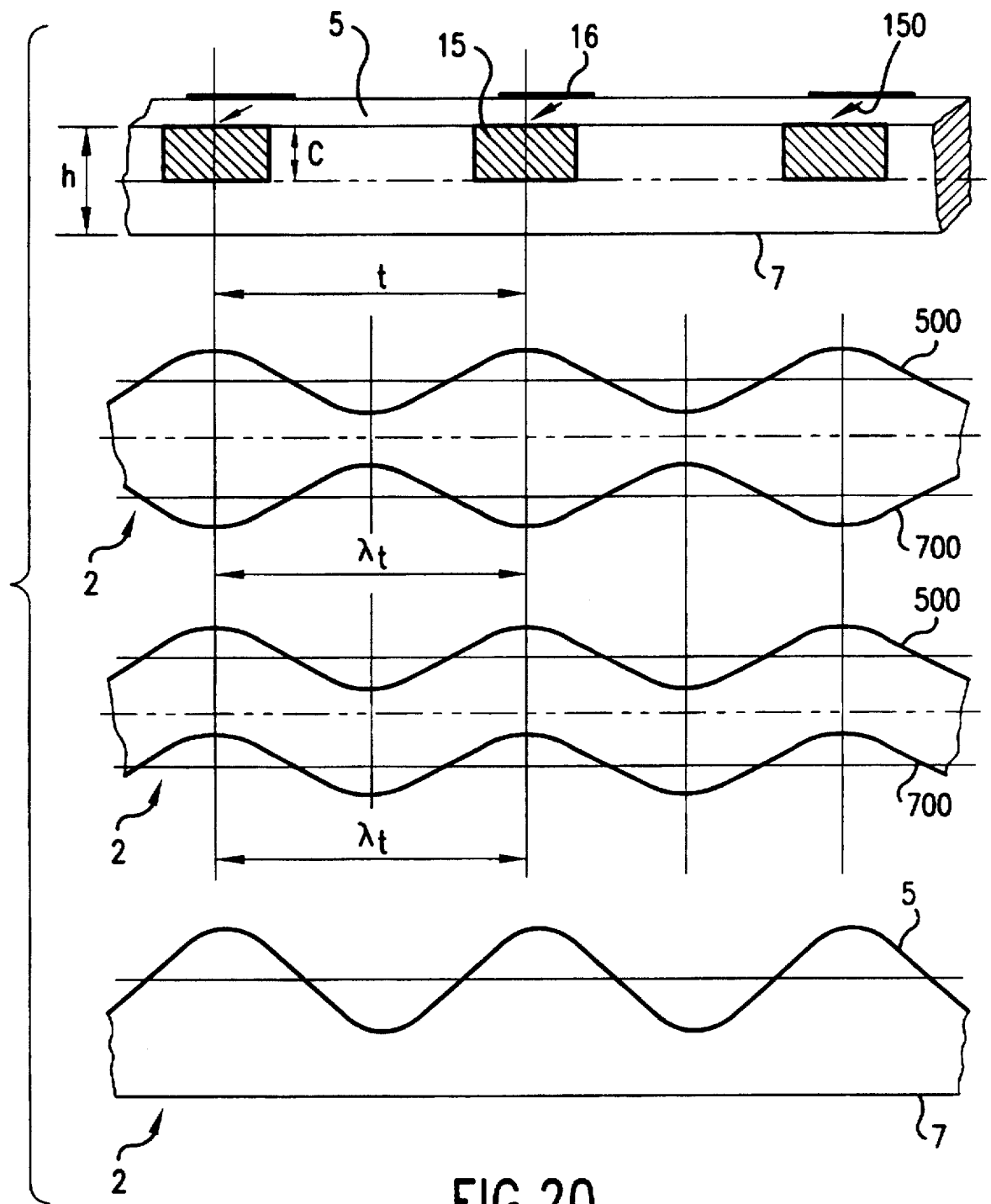

FIG. 19e shows a developed oscillator 2 with a modification of the electrodes 15, 16 in which the entire connections between the electrodes are embodied as lines 70. It is feasible to produce such a structure photochemically. The invention provides for a particular configuration of electrodes for each standing wave generator 9, 10, 11 as shown in FIG. 20. In this embodiment the electrodes 15, 16 have a height c which equals about half the height h of the oscillator 2 and are spaced apart by a distance l. In this case an elastic wave 700 is simultaneously produced with the longitudinal wave 500. The amplitude ratio between longitudinal wave and elastic wave can be varied by varying the height of the electrodes 15, 16. The length $\lambda_r$ the elastic wave depends on the height h of the oscillator. By varying the height c of the electrodes 15, 16 and the height h of the oscillator 2 the values can be adjusted so that the amplitude and the length of the elastic wave equals the amplitude and the length $\lambda_l$ of the longitudinal wave, as shown in the wave diagram of FIG. 20. When both waves are simultaneously generated in the oscillator 2 the deformations caused by them superimpose. At the bottom of FIG. 20 the entire deformations of the oscillator 2 are shown. It is rendered visible that the amplitude of the superimposed wave of the operational face 5 equals double the amplitude of the longitudinal wave and that the longitudinal deformations and the elastic deformations mutually compensate on the leading face 7, that is, said leading face 7 is not deformed, no wave results.

Figure 21A:
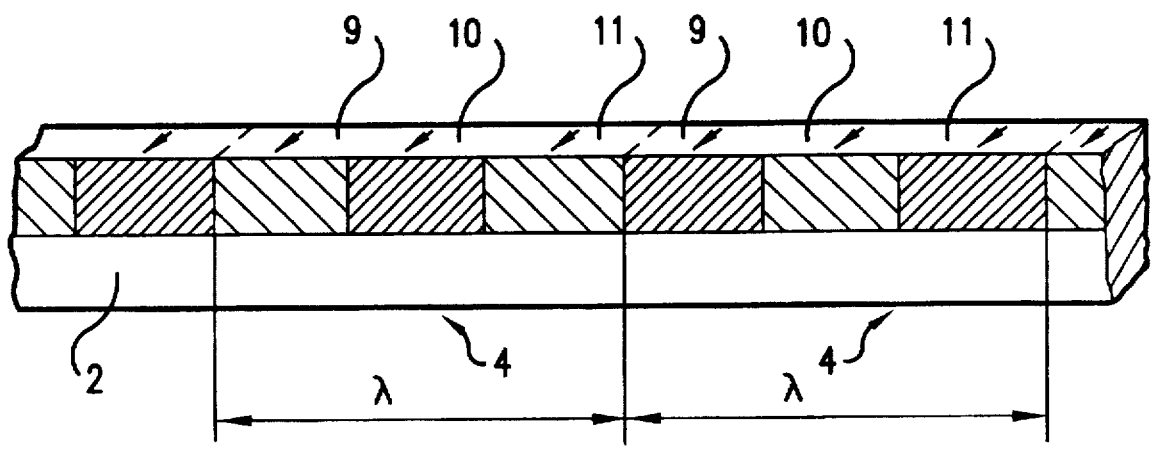
Figure 21B:
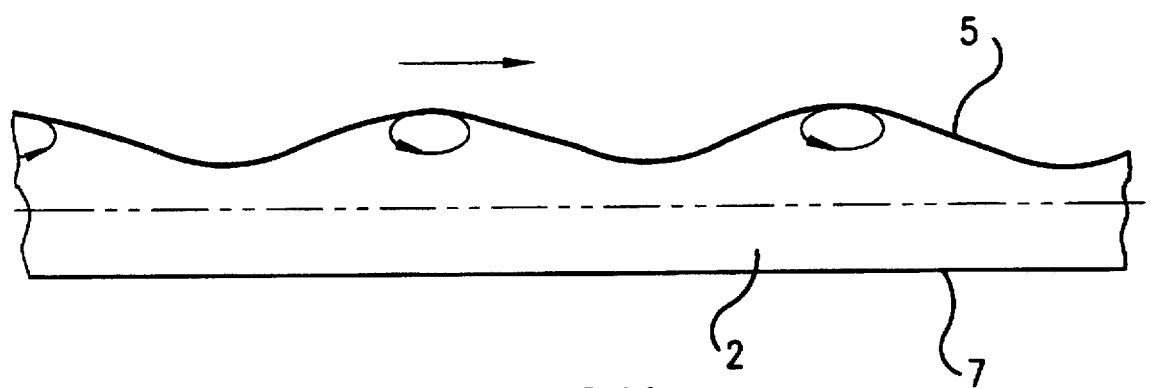

It is obvious that, when generating three standing waves in the oscillator 2 by the three generators 9, 10, 11 in analogy to the generator shown in FIG. 21a, a non-symmetrical travelling wave is generated in the manner as shown in FIG. 21b. Said wave deforms the operational face 5, the leading face 7 being not deformed. In this embodiment of a piezoelectric motor the oscillator 2 energy is not absorbed by the sound isolating base 8. Therefore, such motors have a potentially higher efficiency.

Figure 22A:
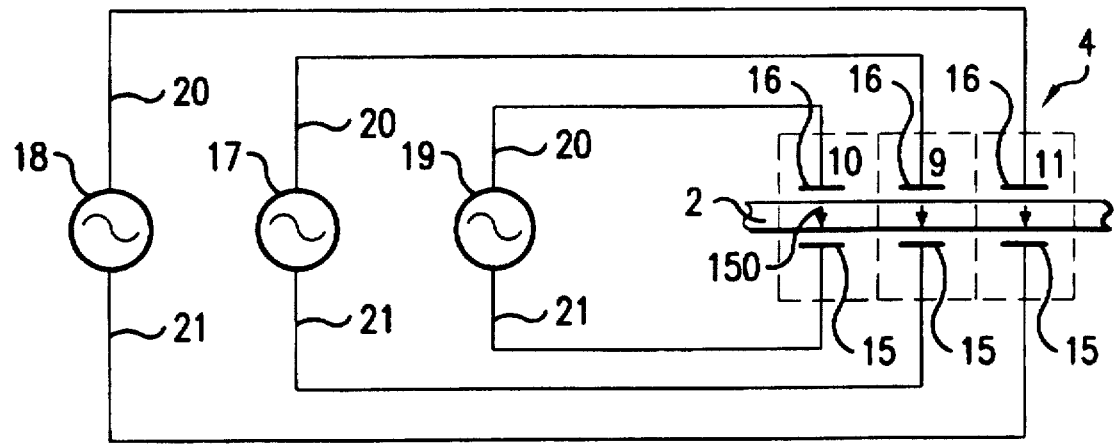
Figure 22B:
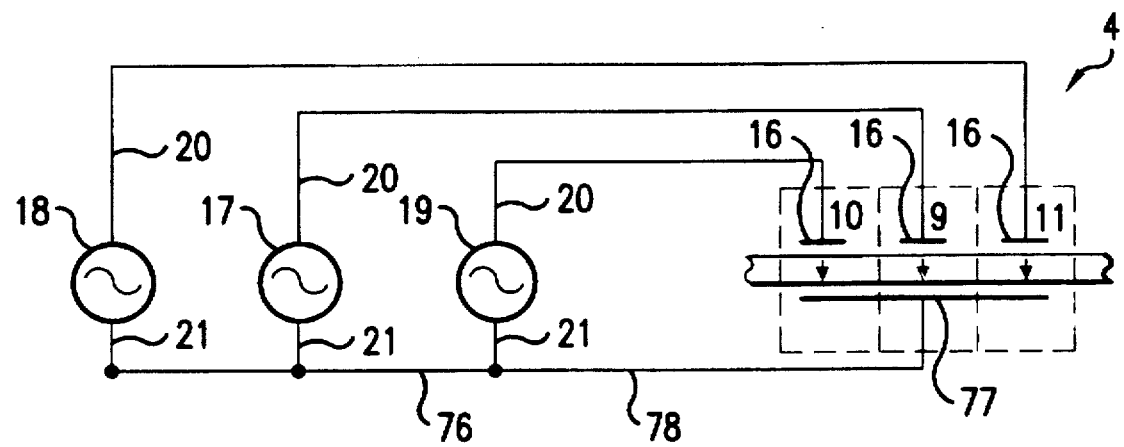
Figure 22C:
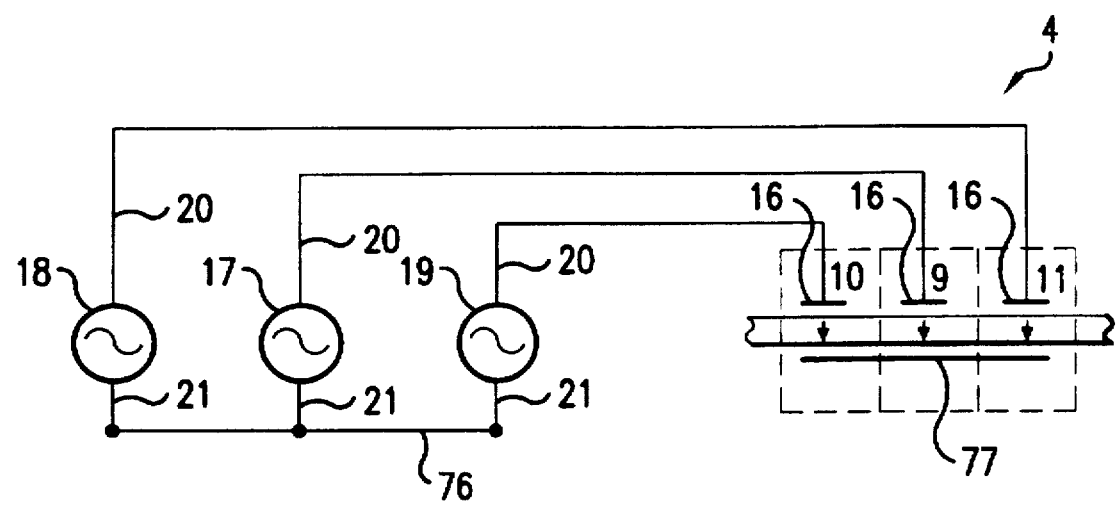

The invention provides different modifications for controlling the standing wave generators 9, 10, 11 via the excitation sources 17, 18, 19. FIGS. 22a–22c shows the circuits illustrating the general excitation principle for connecting the excitation sources 17, 18, 19 to the generators 9, 10, 11.

The circuit according to FIG. 22a exemplifies the separate excitation of the generators 9, 10, 11 via the sources 17, 18, 19. It is obvious that this circuit can be substituted for the circuit according to FIG. 22b in which all contacts 21 of the sources 17, 18, 19 are interconnected in a common collective line 76 and the entire electrodes 15 of the generators 9, 10, 11 are substituted for a common electrode 77. The collective line 76 and the common electrode 77 are connected with one another via a connection line 78. Such a modification does not change the general excitation principle, however, means a simplification of the circuit. Furthermore, it is feasible to supply equal electric potentials phase-shifted by 2/3 π (120°) to one another, since the sources 17, 18, 19 are equal in amplitude and frequency, and since the electric resistances of the generators 9, 10, 11 are equal to one another no current flows through the connection line 78 and it can be omitted according to FIG. 22c. This includes that the common electrode 77 needs no electric contact.

Figure 23:
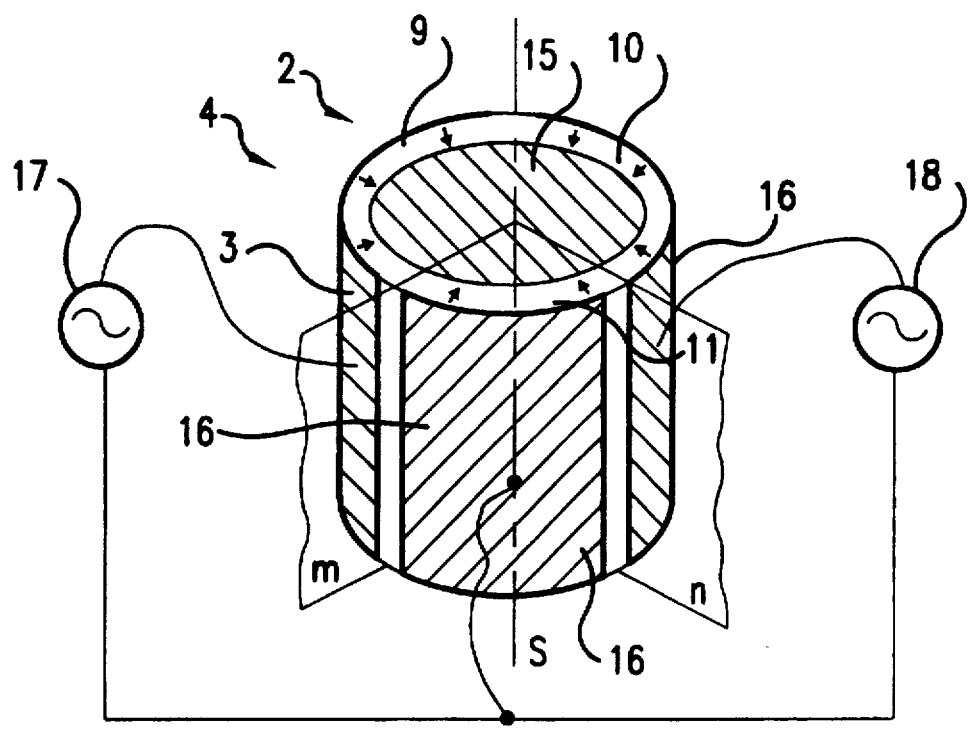

A further simplification of the invention is feasible according to FIG. 23 in which the oscillator 2 including the travelling wave generator 4 is visible. Again the three standing wave generators 9, 10, 11 are represented, 9 being the basic generator and 10, 11 being boosters for the standing wave generation. The generator 11 only is voltage supplied in connection with the generators 9, 10, whereas the generators 9 and 10 are directconnected to the voltage sources 17, 18. Therefore the generator 11 can be considered as a common portion of the generators 9, 10 arranged between two areas m, n being split along an area s, and in which the portion between the areas m and s belongs to the generator 9 and the portion between the areas s and n belongs to the generator 10.

Figure 24:
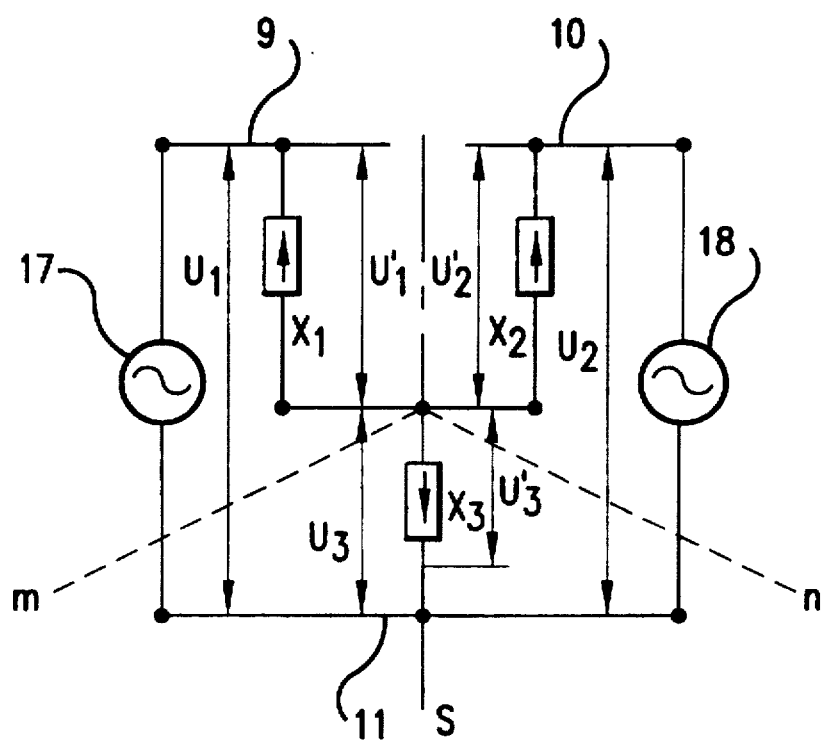

The electrodes 15, 16 of the generators 9, 10, 11 are connected to the excitation or voltage sources 17, 18, the latter supply them with voltages $U_1$, $U_2$. In the equivalent circuit shown in FIG. 24 $X_1$, $X_2$, $X_3$ are the impedances of each of the portions of the generators 9 and 10. When the generator portions 9 and 10 are equal to one another then the impedances $X_1$, $X_2$, $X_3$ are equal. According to the invention the phase angle between the voltages $U_1$, $U_2$, $U_3$ has to be ±120° or approximately that value. In this embodiment the voltages $U_1$, $U_2$ applied across the oscillator 2 are divided by the dividers $X_1$, $X_2$, $X_3$ and the resulting portions are summed up at $X_3$. The voltages $U_1'$, $U_2'$, $U_3'$ result at each portion of the oscillator 2. When $X_1=X_2=X_3$ then $U_1'=U_2'$. The voltage $U_3$ is slightly smaller than $U_1$ and $U_2$ respectively, and the voltage $U_3$, smaller than $U_1$ and $U_2'$, respectively. The phase shift angle $\phi$ between the voltages $U_1$ and $U_2$ is about 120°. The phase angle between the voltages $U_1'$ and $U_2'$, respectively, and $U_3'$ is about $\phi/2$. Since the common portion 11 of the generators 9 and 10 is, considered by the current passing them, connected in opposition to the separate portions, the phase of its excitation voltage is rotated by 180°; that is, the phase $\phi'$ of the voltage $U_3'$ which excites the second booster 11 is $180°-\phi/2$; accordingly, when in this special case $\phi=120°$, then $\phi'=180°-120°/2$ 120°.

Figure 25:
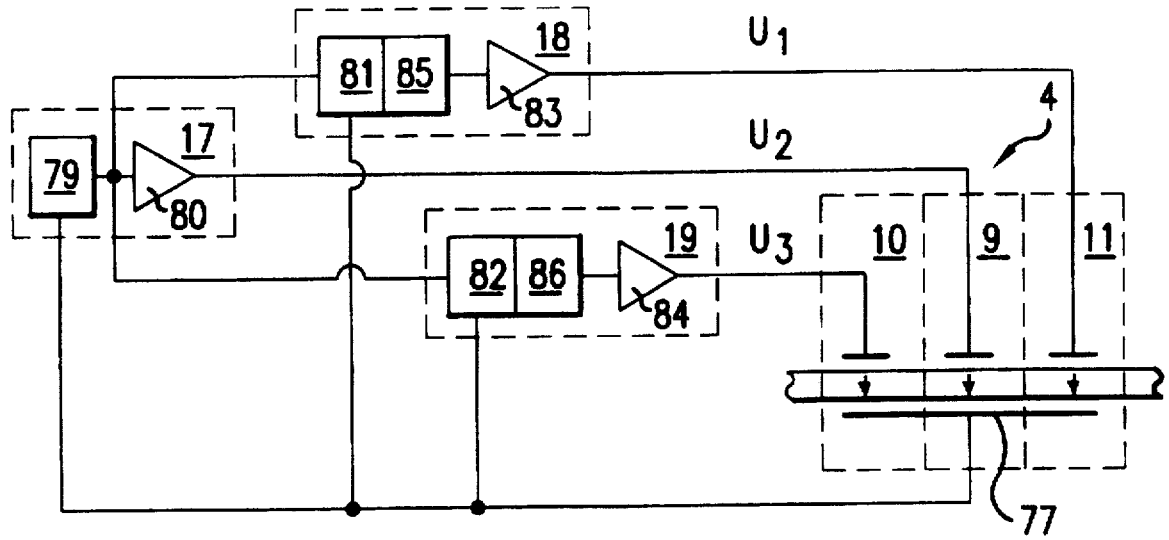

In this manner, in the present embodiment, the third standing wave is excited by the common portion 11 of the two standing wave generators 9 and 10. Said common portion is excited by a voltage formed by superposition of portions of the voltages $U_1$ and $U_2$. This is the reason why there is no excitation source 19 in this embodiment, which means a considerable simplification. When the present invention is reduced to practice it is difficult, due to the separate excitation of the generators 9, 10, 11, to ensure a simple synchronous operation and in-phase-operation of the excitation sources 17, 18, 19. Therefore the embodiment according to FIG. 25 of the invention offers a self-excitation which does not change the feature of the invention. In the case of a self-excitation of the generators 9, 10, 11 the excitation source 17 of the basic generator 9 represents the source for the carrier excitation signal and the excitation sources 18, 19 are, practically speaking, employed to rotate the phase and to enhance said signal. In this case, the excitation source 17 includes a generator 79 for the electrical carrier signal and a power amplifier 80, the sources 18, 19 include phase shift means 81, 82 and buffer amplifiers 83, 84. Additionally, the sources 18, 19 can include means 85, 86 for pole reversal of the phase angle. Said embodiment operates as follows. The carrier signal generator 79 produces an electric signal the frequency of which equals the mechanical resonant frequency $f_0$ of the oscillator 2. This signal is fed into the amplifier 80 and into the phase shift means 81, 82 of the sources 18, 19. The phase shift means rotates the phase of the signal by $\pm 2/3\ \pi\ (\pm 120°)$. From the phase shift means 81, 82 the signal of each source 18, 19 is fed into the means 85, 86 for pole reversal of the phase angle. Subsequently the signals are amplified in the amplifiers 83, 84. The three signals amplified in the amplifiers 80, 83, 84 are fed as excitation voltages of the sources 17, 18, 19 into the respective standing wave generators 9, 10, 11.

The frequency diagrams according to FIG. 16 of the piezoelectric motor are continuous, i.e. there are no points of unstable states. Hence, the frequency of the control generator 79 can dwell in any range of the frequency curve 42. If required, it is feasible to vary the rotation frequency of the rotor 6 by varying the excitation frequency. By means of the devices 85, 86 it is feasible to reverse the rotation direction of the rotor by reversing the phase of the signals from the sources 18, 19 into the respective opposite direction (by $\pm 120°$ related to the phase position of the signal from the source 17).

Figure 26:
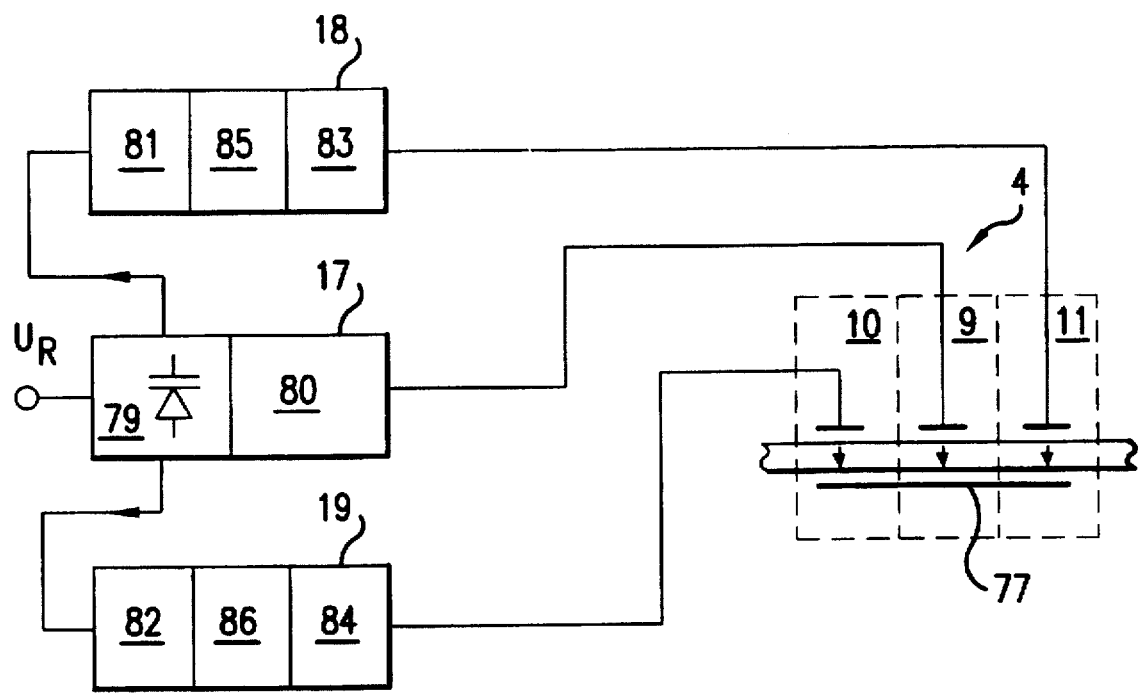
Figure 27:
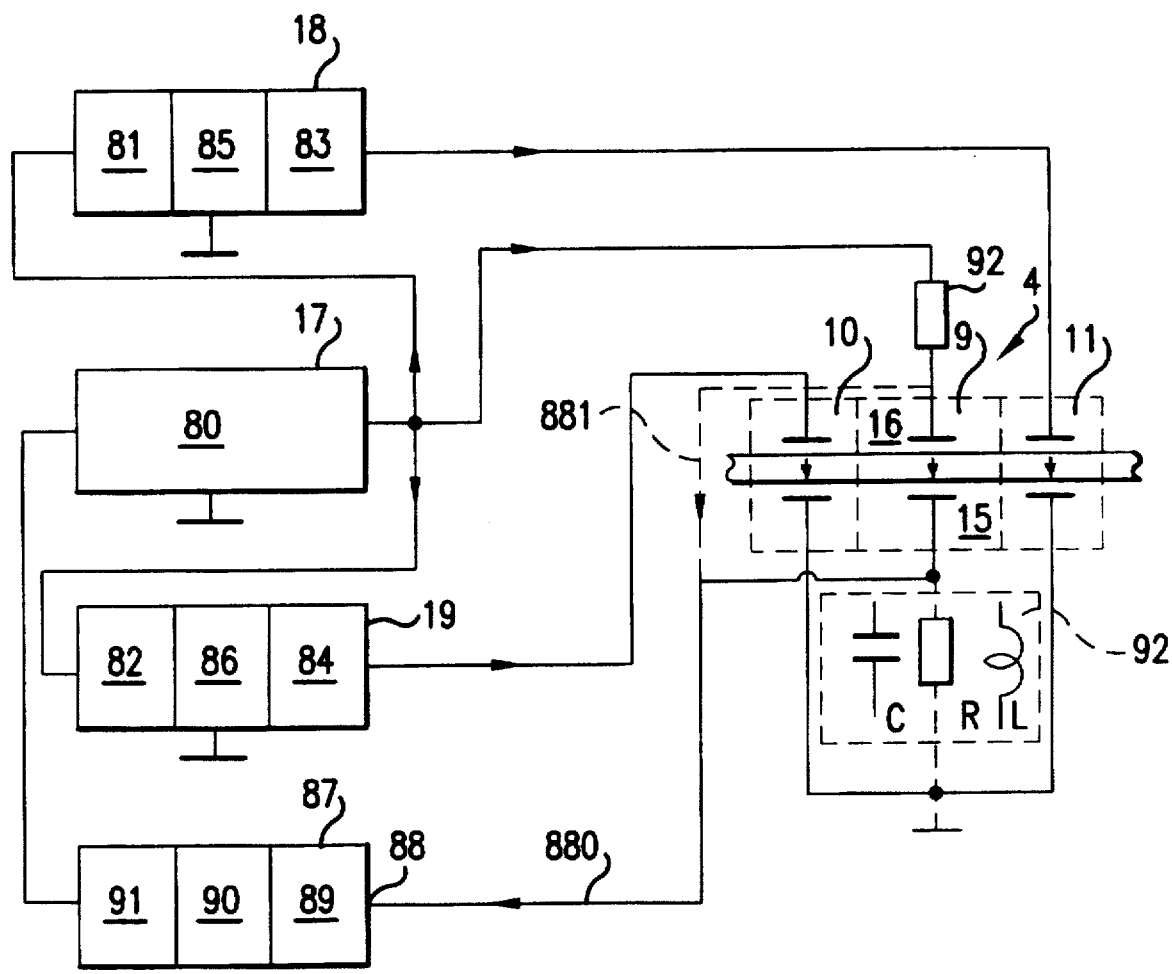

In FIG. 26 an embodiment of the motor is represented comprising a control generator 79 operating as a frequency controlled autogenerator. In said embodiment the rotation frequency of the rotor 6 can be varied by varying the control voltage $U_R$, that is, by varying the excitation voltage of the control generator 79. In many applications of the present invention it is very suitable that the operation frequency of the motor is substantially equal to the mechanic resonant frequency $f_0$ of the oscillator 2, due to possible destabilising effects. Such a modification is shown in FIG. 27. According to said modification the motor additionally includes a positive feedback branch 87 comprising an input 88, a filter 89, a phase-shift chain 90 and an amplifier 91. Additionally, said modification includes an impedance 92 series-connected to the basic generator 9, the excitation source 17 which, in the present case, only includes the amplifier 80. The input 88 of the feedback branch 87 connected via a line 880 to the electrodes 15, 16 of the impedance 92 include in the basic generator 9. With dashed lines a second possible connection 881 to the impedance 92 is shown in FIG. 27. The output of the feedback branch 87 is connected to the buffer amplifier 80 of the source 17. The impedance 92 can be a resistor R, an inductor L, or a capacitor C. In its enity the considered modification is an electromechanical autogenerator which is excited at the mechanical resonant frequency $f_0$ of the oscillator 2. The auto-generator is reduced to practice by a basic generator 9 and its excitation source 17 and the additional feedback branch 87, constituting a closed electromechanic chain. In order to excite said chain on the mechanical resonant frequency $f_0$ of the oscillator 2 the phase diagram 43 of FIG. 16 of the motor is employed, having a zero-passage in the vicinity of the frequency $f_0$.

The above described electromechanical chain is tuned in such a manner that the amplification factor at the frequency $f_0$ is greater than unity and the phase shift is zero between input signal and output signal at said frequency for each discontinuity of the chain; the amplification factor being preselected by the amplifiers 80, 83, 84 and the phase shift by the phase shift chain 90. The size of the phase shift of the signal depends on the component selected for impedance 92. In the case of employing a resistor the phase shift only has to correct and lies within a range of $\pm 10°$. When inserting a capacitor C it lies in the range of $+90°$ and when employing an inductor L it lies at $-90°$.

Figure 28:
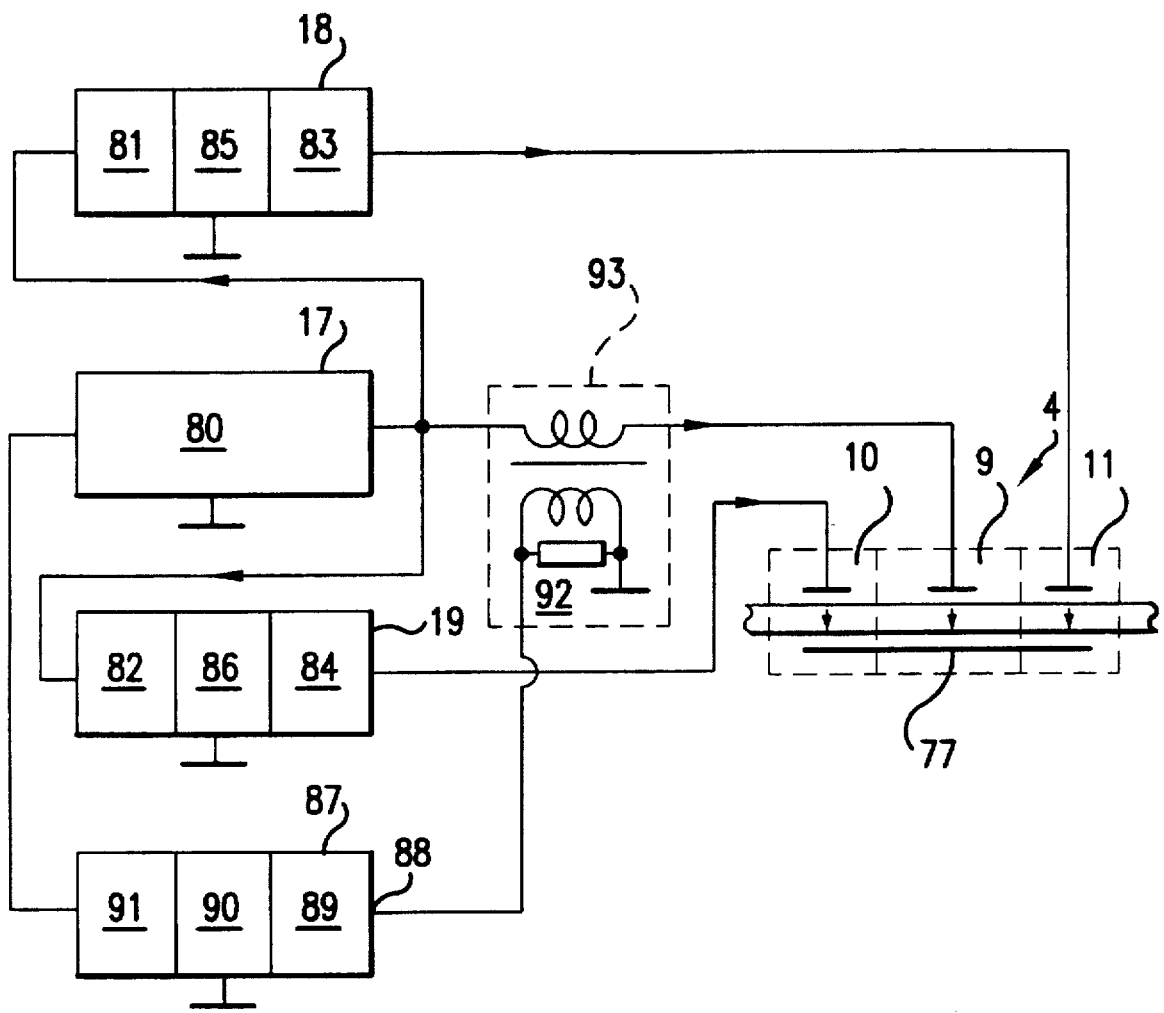

FIG. 28 shows an embodiment comprising a current transformer 93 in the input circuit of the feedback branch 87. Said embodiment simplifies the circuit for the electromechanical auto-generator for the case that the electrode 77 output is omitted. In its entity the arrangement operates in analogy to that of FIG. 27, considered hereinabove.

Figure 29A:
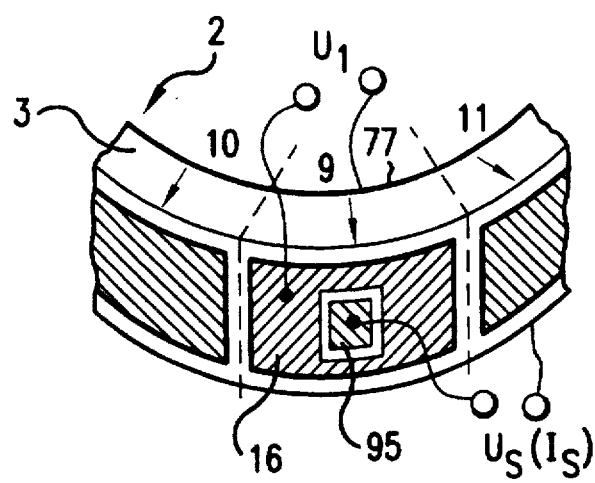
Figure 29B:
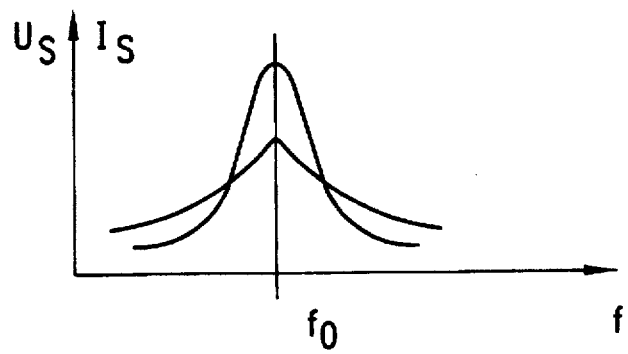
Figure 29C:
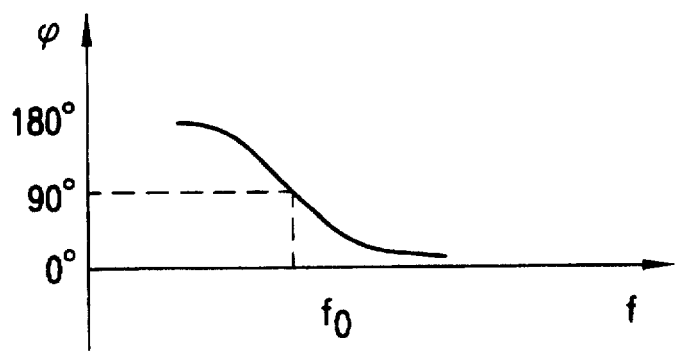
Figure 29D:
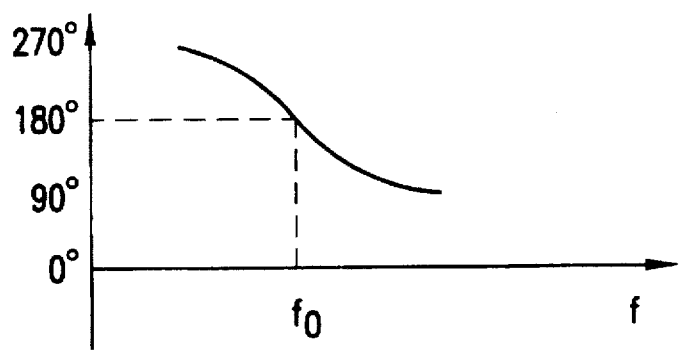

In a few applications which require a precise tuning of the excitation voltage $U_1$ ($U_2$, $U_3$) to the mechanic resonant frequency $f_0$ of the oscillator 2 a modification is feasible which includes an additional feedback electrode 95 shown in FIG. 29a. Said electrode is arranged at the locus of the mechanical stress maximum of the standing wave of the basic generator 9. Two modes of operation of the electrode 95 are feasible: no-load operation and short-circuit operation. In no-load operation, the electrode 95 is no resistance for the electrical load. When the generator 17 is excited a voltage proportional to the mechanical stress of the standing wave of the basic generator 9 is produced due to the direct piezoelectric effect on the electrode 95. A short-circuit current flows due to the low resistance in the case of the short-circuit operation of the electrode 95 and the electrode 77. Said current is proportional to the mechanical stress of the standing wave of the basic generator 9. The frequency diagrams and the phase diagrams of the no-load voltage $U_S$ and of the no-load current $I_S$ are used for the electromechanical auto-generator and associated feedback electrode 95, according to FIGS. 26b–29d.

Figure 30:
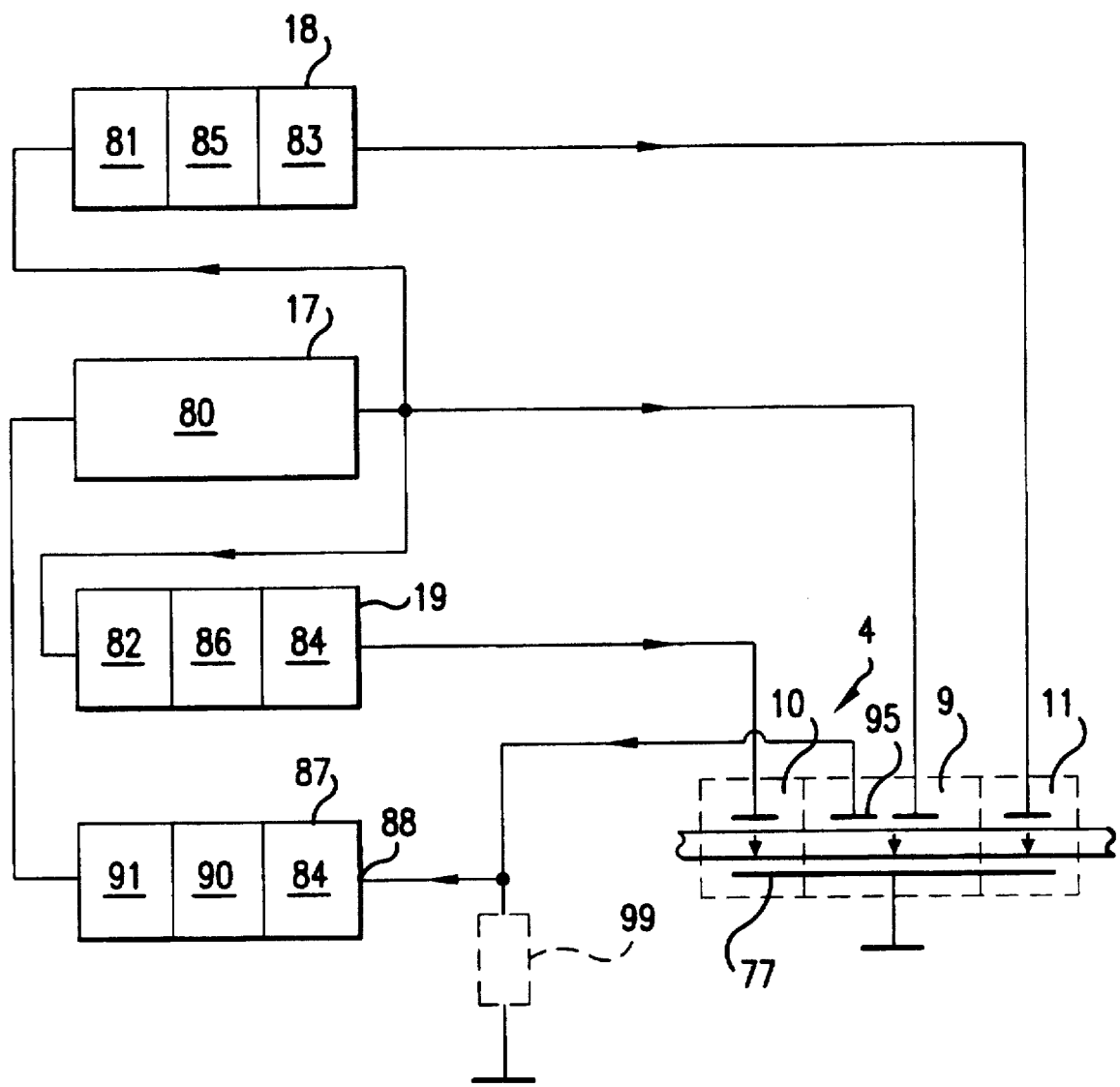
Figure 31:
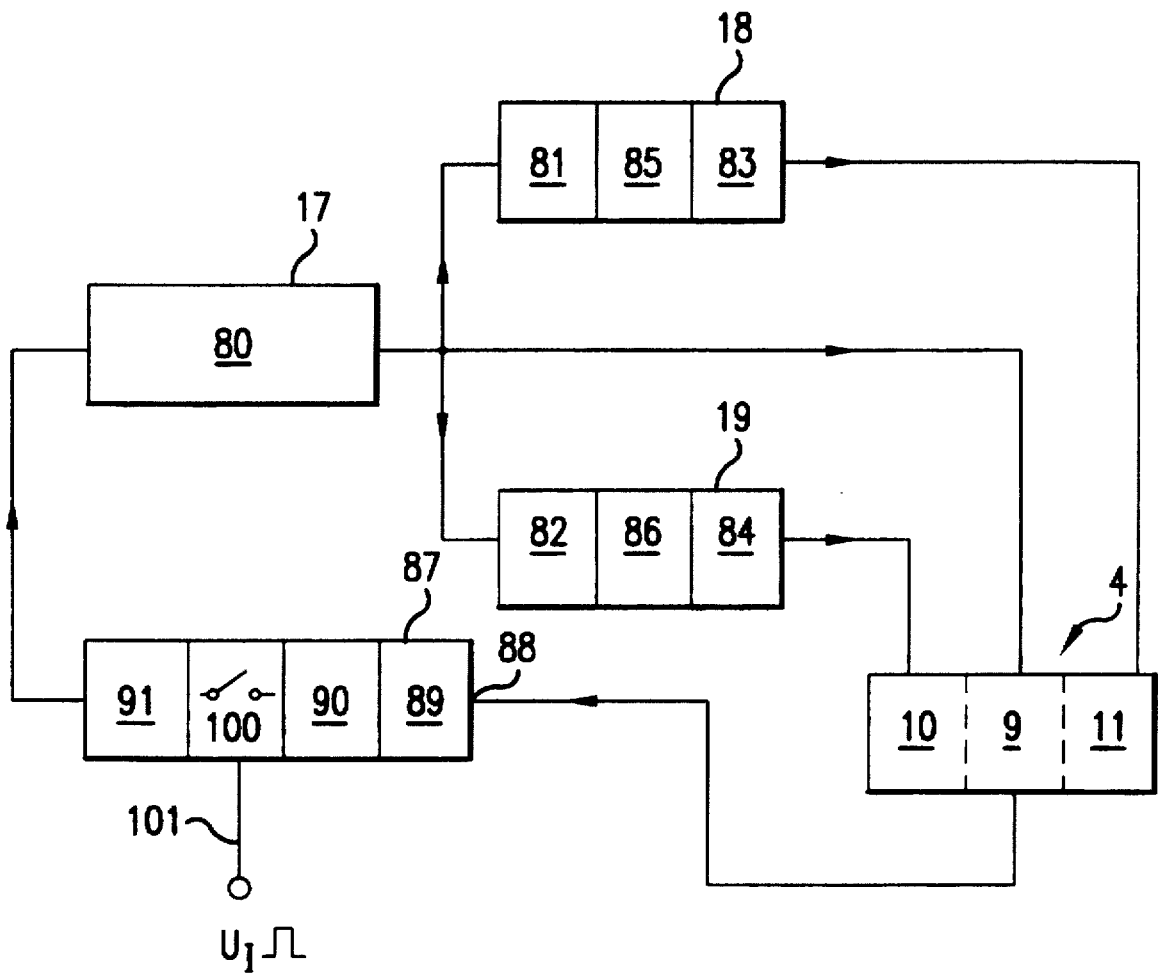

FIG. 30 shows an embodiment of the electromechanical auto-generator and associated feedback electrode 95. The function of the electrode 95 is pre-determined by a resistor 99. The arrangement is tuned via the amplification factor of the feedback and via the phase shift, in analogy to FIG. 27. The present invention also provides for the application of a piezoelectric motor in step operation with a minimum start-stop time. To this end, according to FIG. 31, a switch 100 having a control input 101 is provided in the feedback branch 87 for on-off switching the electric circuit. When switching OFF, the switch 100 opens or closes the electric signal circuit of the feedback for a short time. In both cases the control of the electromechanical auto-generator of the motor is interrupted at a minimum stop time. When switching ON the feedback branch 87 via the switch 100 the auto-generator is rapidly started. The switch control and, hence, the control of the step operation is carried out via a pulse control voltage $U_1$ of optional period of time.

Hereinafter a number of embodiments of the mechanical and electrical design of the piezoelectric motor are described.

Figure 32:
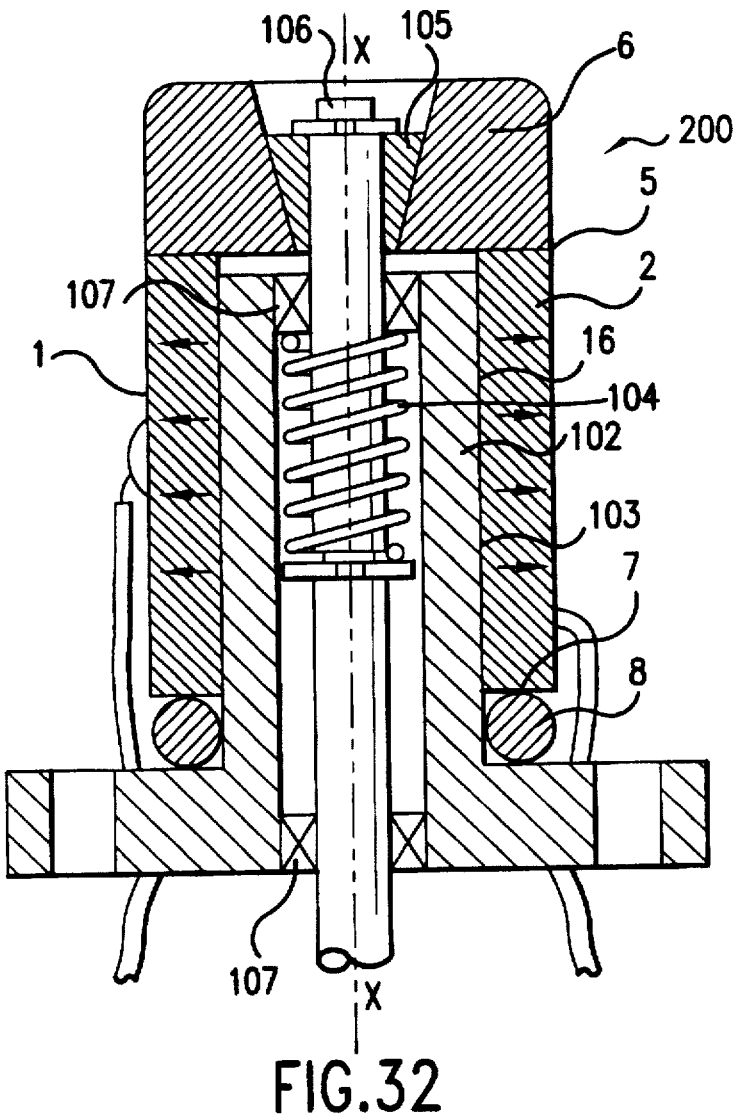
Figure 33:
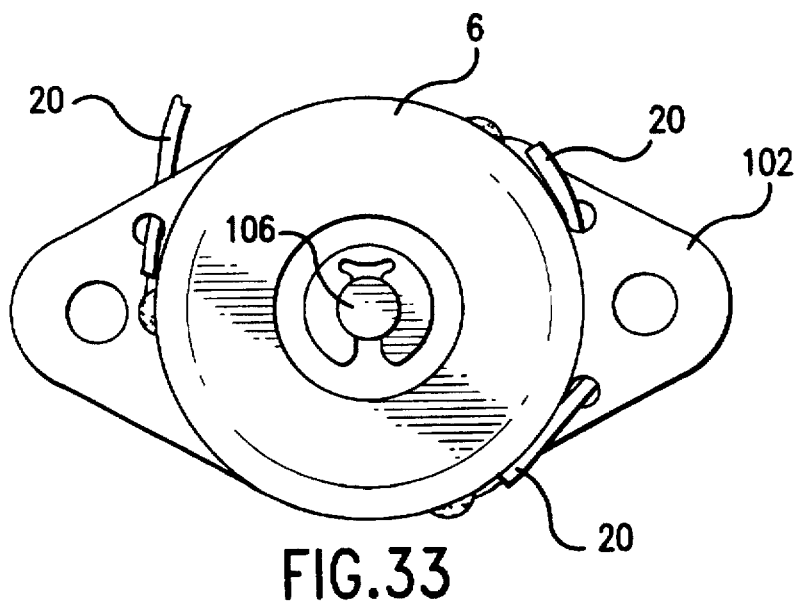

FIGS. 32 and 33 represent an embodiment of the piezoelectric motor including an oscillator 2 elongated along its longitudinal axis X-X and one (or two) travelling wave generator(s). A piezoelectric motor 200 comprises a stator 1 and associated oscillator 2 which simultaneously constitutes the wave guide 3 for the longitudinally travelling wave. The oscillator 2 is arranged for free running on a mounting base 102. Provided that the mounting base 102 is made of metal, an insulating backing 103 has to be provided between the former and the oscillator 2 in order to eliminate a short-circuit between the electrode 16 (77) and the stator 1 of the motor. The oscillator 2 abuts against the sound-isolating support 8 via its non-functional leading face 7. The rotor 6, connected via an elastic sleeve 105 to a motor axle 106, is pressed against the operational face 5 of the oscillator 2 by means of a spring 104. The axle 106 is seated on a ball-bearing 107 in such a manner that it can freely move in longitudinal direction and, accordingly, can transmit the contact pressure executed by the spring 104 to the rotor 6.

When a travelling wave is generated in the oscillator 2 the operational face 5 of the oscillator 2 transmits a moment of rotation to the rotor 6 and induces the latter to rotate. The rotation is transmitted to the motor axle 106 via the elastic sleeve 105. When a mechanical load is applied upon the axle 106 the oscillator 2 produces a moment of rotation opposite to the moment of rotation acting upon the axle 106 and the rotor 6. Since the oscillator 2 abuts via its leading face 7 against the sound isolating support 8, a rotation of the oscillator 2 is eliminated due to the friction moment between support 8 and the leading face 7. Said friction moment always is greater than the moment of rotation of the motor in friction contact, therefore the oscillator 2 remains in a position of rest. This embodiment exhibits a simple construction which permits a fast assembly. It permits manufacture of minute geometries. Since external diameters of only 2 to 3 millimeters are feasible, it is competitive with conventional electromotors.

Figure 34:
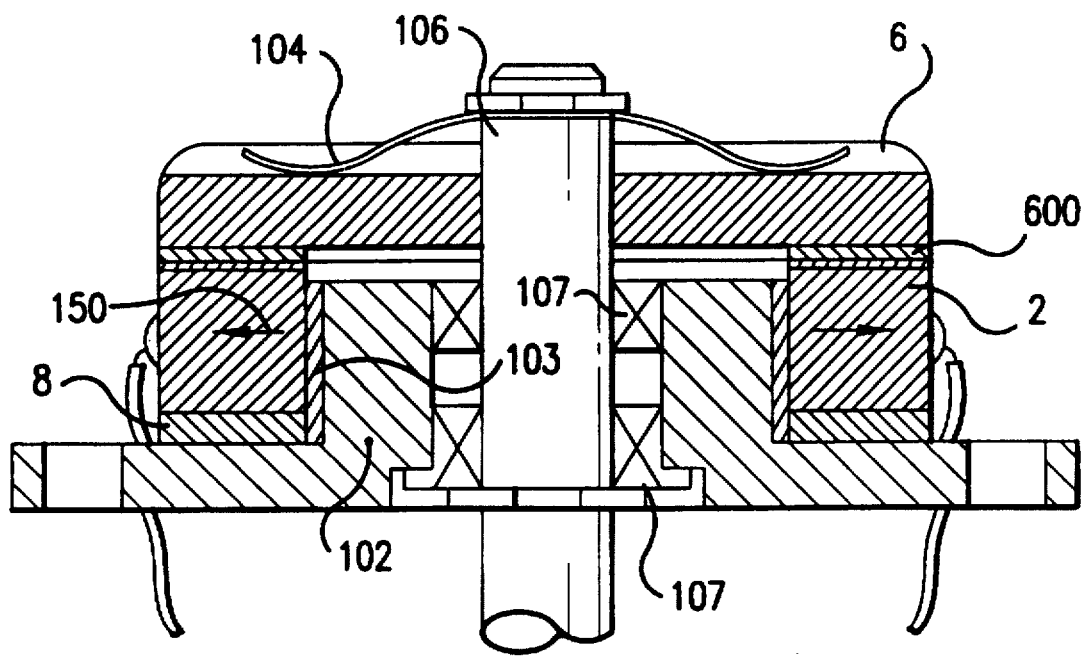

FIG. 34 shows the motor comprising an annular oscillator 2 of sufficiently great diameter (greater 120 mm) and a sufficiently large operation face 5 (15 to 20 mm width of the annular face). The oscillator 2 offers space for more than ten travelling wave generators 4. Thus a high motor output is ensured. Accordingly, this embodiment requires a suitable heat conductivity of the mounting base 102 and the rotor 6 to dissipate the heat produced in the oscillator 2 while operating. To this end, preferably aluminium and its alloys are used. In this embodiment the rotor 6 of the motor is coated with a thin friction layer 600 which determines the friction properties of the rotor 6.

Figure 35:
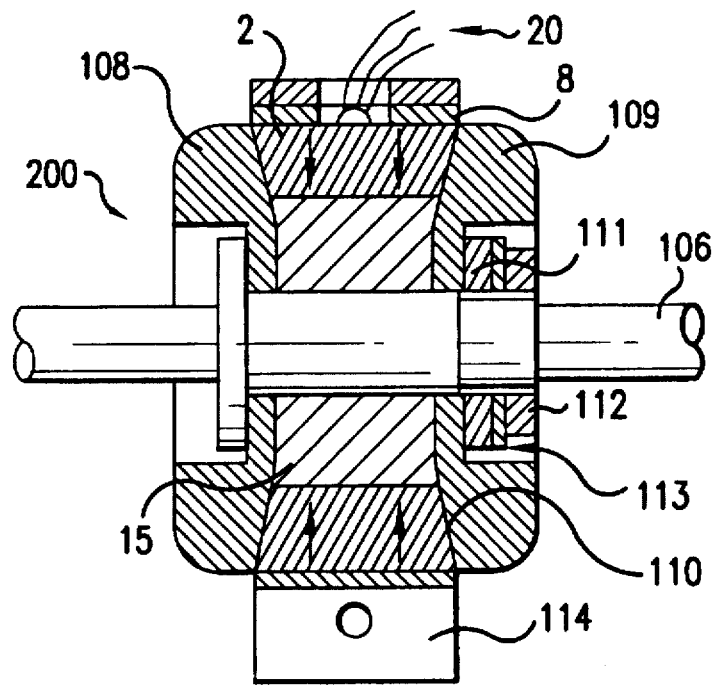
Figure 36:
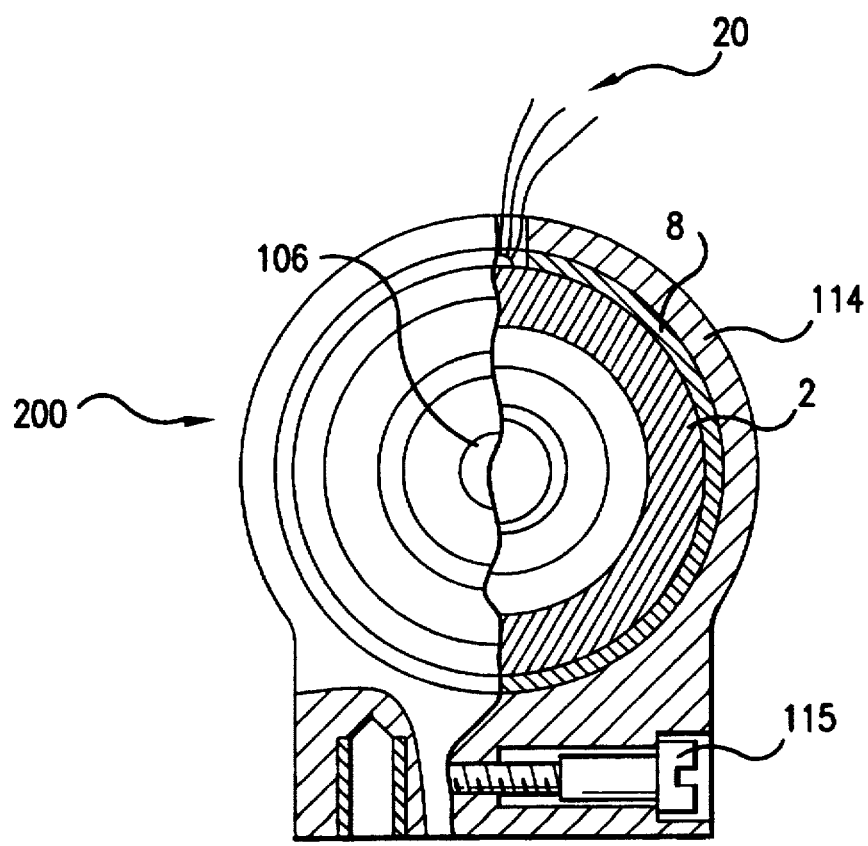

FIGS. 35 and 36 show a piezoelectric power motor 200. Said motor comprises a rotor constituted of the two parts 108, 109. The part 108 is secured to the axle 106. The part 109 is displaceable along the axle 106. Both rotor parts are pressed against two conical operational faces 110 of the cylindrical oscillator 2 via an elastic support 111 which, in turn, is pressed between the part 109 and a disk 113 by a nut 112. The material of the elastic support can be selected from elastic synthetics, such as polyurethane. The oscillator 2 of said motor is installed in a housing 114 illustrated by a bracket provided with a clamp bolt 115. The motor has no bearing. The rotor 108, 109 is centered by the conical operational faces 110 of the oscillator 2. This construction permits a maximum output of the piezoelectric motor. The output is only limited by the dynamic strength of the piezoceramic oscillator 2.

Figure 37:
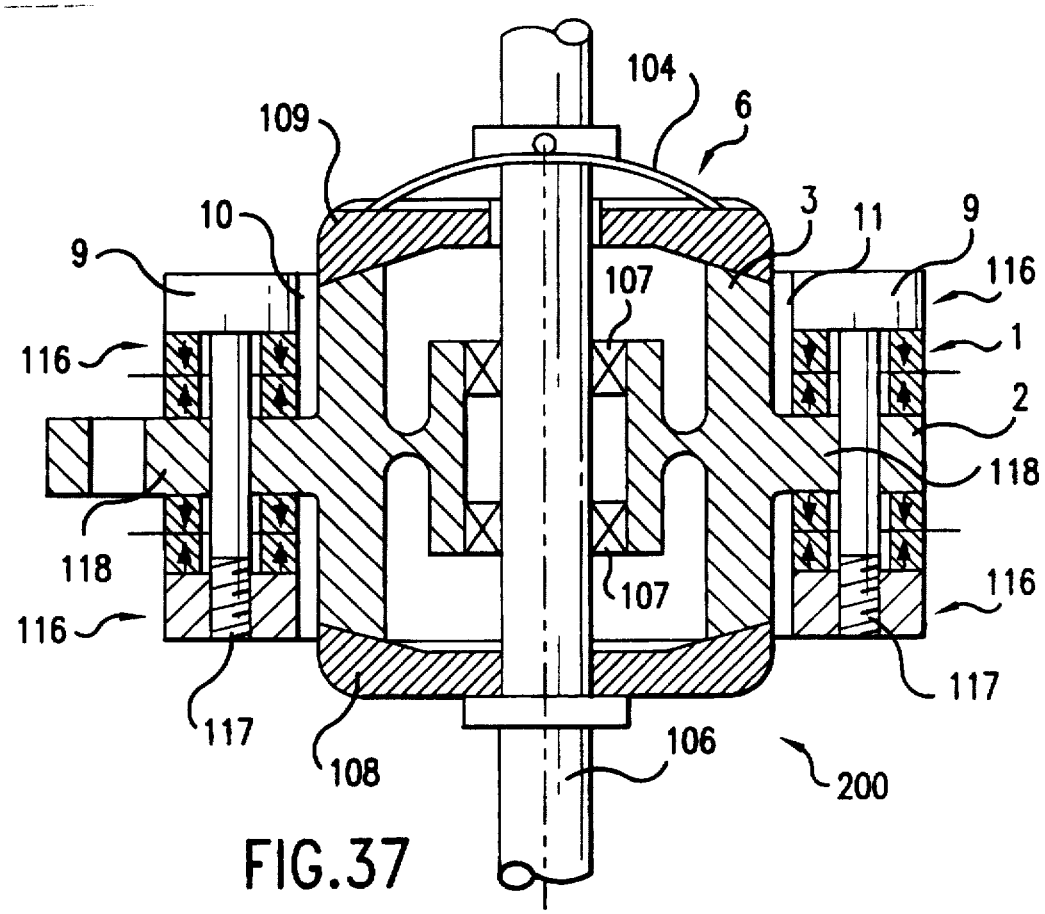
Figure 38:
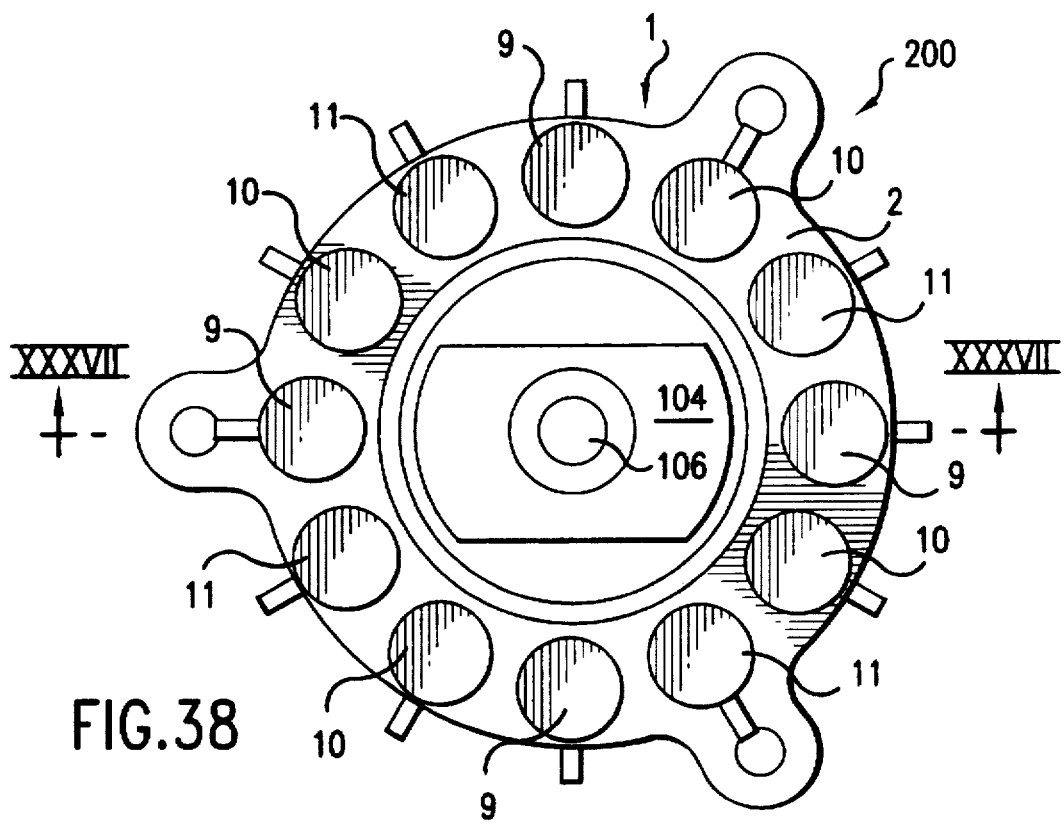

The present invention permits construction of a still more powerful piezoelectric motor in which a metallic wave guide is used. A feasible embodiment of such a motor 200 is shown in the FIGS. 37 and 38. It comprises the stator 1 and the oscillator 2 with associated metallic wave guide 3. The wave glide 3 is made of a stable thermally treated steel permitting maximum mechanical stresses in the wave guide. These are considerably greater for steel than for piezoelectric ceramics. Such a motor permits maximum output per volume unit of the wave guide. In the present design the standing wave generators are manufactured in the shape of packets of piezoelectric transducers 116 compressed by bolts 117. They are coaxially arranged about the axle 106 and about the waveguide 3 and are connected to the latter via a flange 118.

Such a motor operates as follows: each group of packets of piezoelectric transducers, constituting standing wave generators 9, 10, 11, produces standing waves 26, 27, 28 (FIG. 7) in the wave guide 3. The superposition of said waves produces the travelling wave 29 which rotates the rotor 6. Such a construction of a piezoelectric motor, including piezoelectric transducer packets, permits unlimited to increase of the mechanical output of the motor by multiplying the number of packets in accordance with the diameter of the wave guide. Each packet having a diameter of 30 mm has a maximum transducer output of about 100 watt. With thirty packets on the oscillator 2 and an efficiency of 30% to 40% of the piezoelectric motor a mechanical output of about 100 watt is obtainable on the motor axle 106.

In accordance with the requirements of a reduction to practice the invention permits a number of modifications of the piezoelectric motor.

Figure 39:
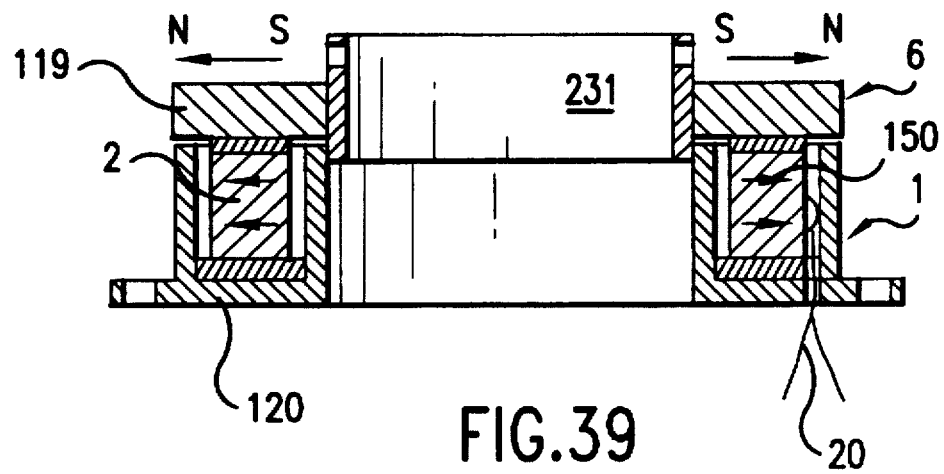

FIG. 39 shows a modification of a motor adapted for use in special optical systems. The motor has a wide central opening 231. The rotor 6 again is pressed against the oscillator 2 by an annular magnet 119 which, in turn, is attracted by the magnetic housing 120.

The invention offers various embodiments of the excitation sources of the standing wave generate 9, 10, 11 of the oscillator 2, four of them containing the most important components being described hereinafter.

Figure 40:
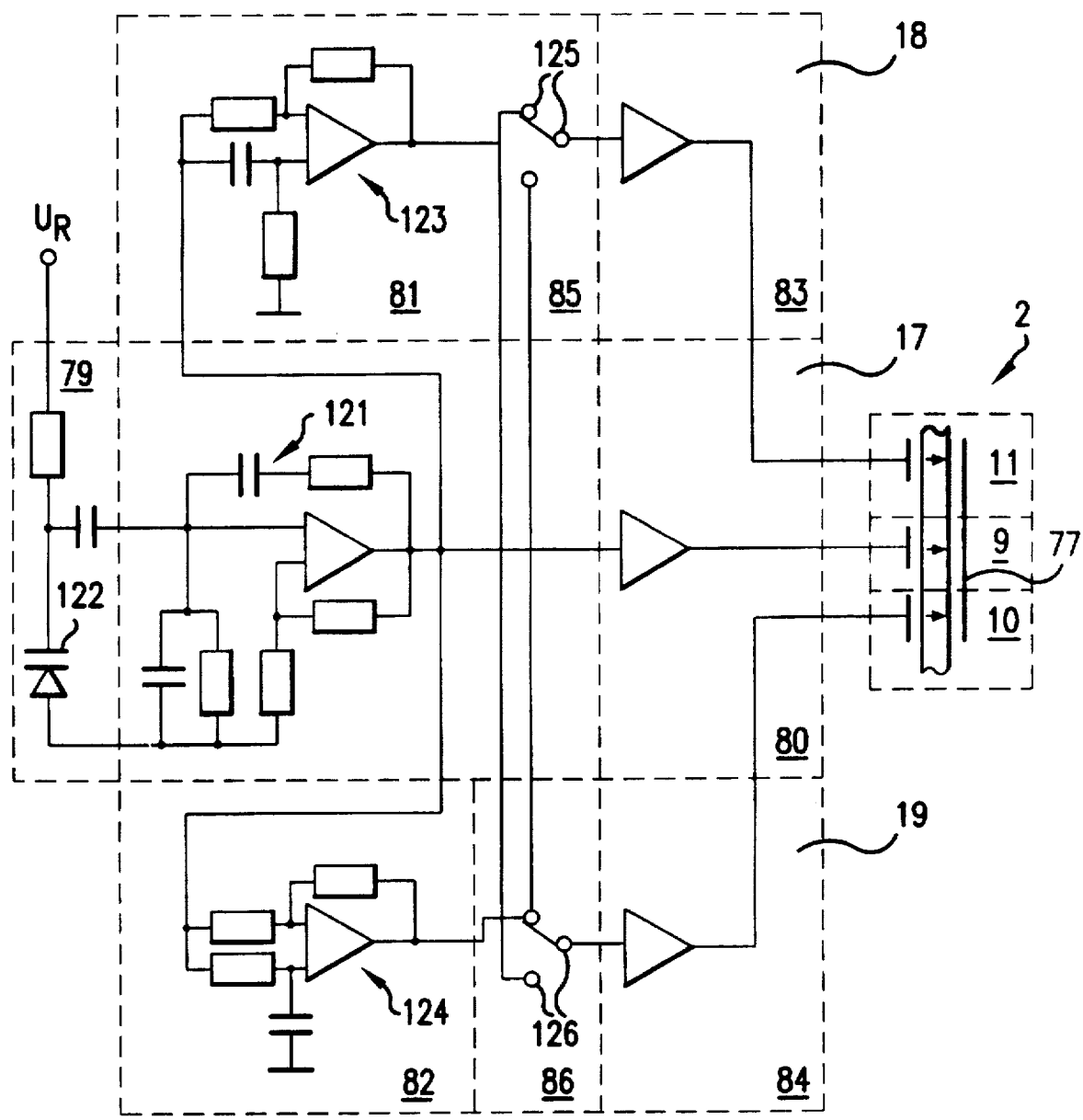

FIG. 40 shows schematic electric circuit diagram of an embodiment of the motor which, by the frequency control principle, controls the rotational speed of the rotor. This circuit corresponds to the block diagrams of FIGS. 25 and 26. The circuit comprises the source 17 of the basic generator 9, including the control generator 79 and the power amplifier 80. The control generator 79 is set up by the auto-generator principle with a Wien-bridge. It is feasible to vary the frequency of the control generator 79 via the control voltage $U_R$ which affects a varactor 122 varying the capacitance of the same. The capacitance of the varactor 122 is selected in a manner to vary via its variation the frequency of the control generator 79 in the range of the frequency curve shown in FIG. 16a. In the present embodiment the sources 18, 19 include the boosters 10, 11, the phase shift means 81, 82, the means for pole reversal of the phase angle 85, 86, and the power amplifiers 83, 84. The phase shift means 81, 82 are constituted of active phase shift branches 123, 124 including operation amplifiers which rotate the signal phases by +2/3 π (120°) and −2/3 π (−120°), respectively. The means 85, 86 connect the change-over switches 125, 126 to earth, the latter carry out the change of function of the phase shift means 81, 82, that is, reverse the sign of the phase shift. Such a reversal permits reversal of the rotation direction of the rotor 6. The amplifiers 80, 83, 84 are identical ones and operate as buffer amplifiers (power amplifiers) having a broad transmission band and nearly operate in the switching mode. The device considered reliably operates both, on the left and on the right of the mechanical resonant frequency $f_o$ of the oscillator 2.

Figure 41:
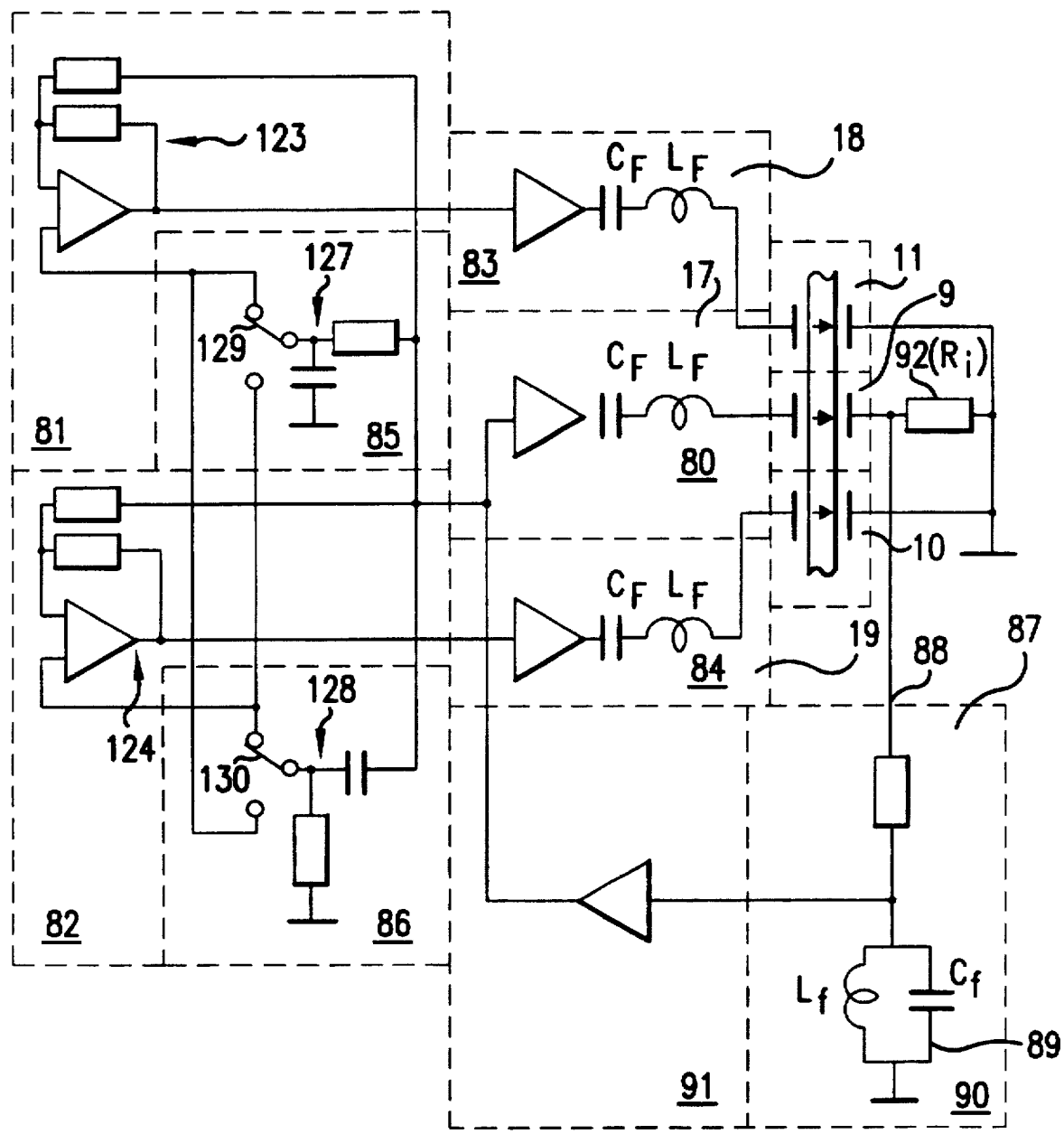

In FIG. 41 a basic circuit diagram according to the block diagram in FIG. 27 (auto-generator) is represented. In the circuit the input 88 of the feedback branch 87 is connected to the impedance 92 embodied as resistor $R_i$. The voltage across this resistor $R_i$ is proportional to the current flowing through the basic generator 9. The phase shift of said voltage at the frequency $f_o$ practically is zero, related to the voltage across the generator 9. From the resistor $R_i$, the voltage proportional to the current is applied across the band-pass filter 89 ($L_f$, $C_f$) and then to the amplifier 91. The band-pass filter 89, tuned to the frequency $f_o$, limits the filter range of the feedback branch 86 and thus eliminates any self-excitation of the circuit in the range of parasitic frequencies of the oscillator 2. The voltage amplified in the amplifier 91 is fed into the output of the feedback branch 87 and from there into the power amplifier 80 of the source 17 of the basic generator 9. Since, in the closed circuit, the overall phase shift is zero at the frequency $f_o$, the amplification factor at this frequency is greater unity, and the source 17, including the feedback branch 87, starts to oscillate at the frequency $f_O$ and, hence, operates as an auto-generator maintaining said frequency irrespective of destabilising affects. The phase shift means 81, 82 include the phase shift branches 123, 124 which, in turn, include two mutually reversible phase chains 127, 128. The reversal is carried out by change-over switches 129 and 130 which practically cause a reversal of sign of the phase shift. Such a reversal permits to reverse the rotation direction of the rotor 6. The power amplifiers 80, 83, 84 are connected to the generators 9, 10, 11 via the separating filter $L_f C_f$. Thus, it is feasible to operate the amplifiers in the switching mode, the output voltages having steep slopes.

Figure 42:
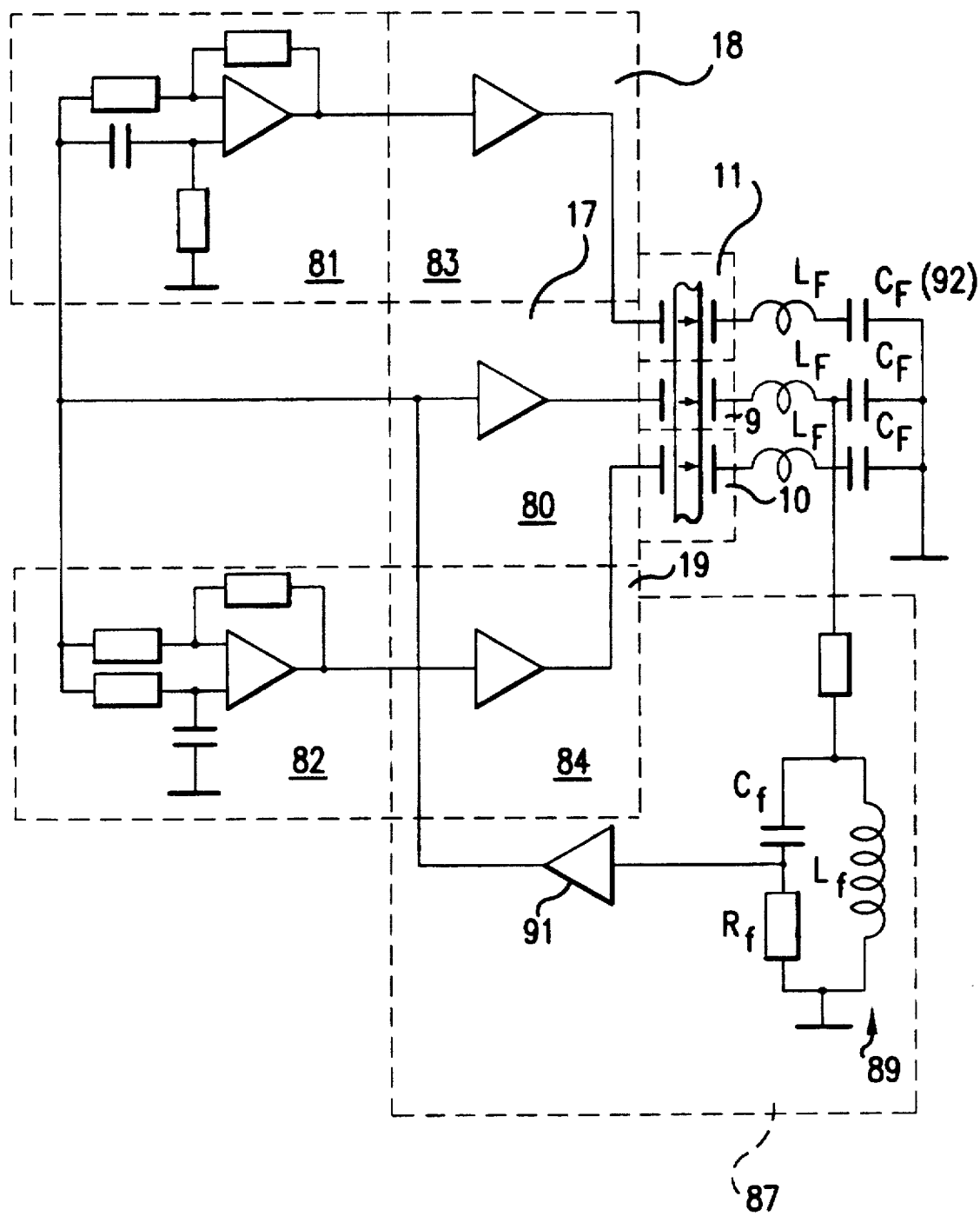

FIG. 42 shows an embodiment in which the capacitor $C_F$ of the separating filter $L_F C_F$ is employed as impedance 92. The voltage amplitude across this capacitor is proportional to the current through the generator 9. The phase, however, is shifted by $-90°$ relative to the generator current. Such a phase shift requires a further shifting by $-90°$. This shift is performed in the capacitor circuit $C_f$ of the band-pass filter 89 where the voltage is shifted by $-90°$ at the resistor $R_f$ relative to the capacitor current. Accordingly, the total phase shift is $-180°$. The amplifier 91 again shifts the phase by $-180°$ so that the total phase shift is zero. Since, with that embodiment, it is not feasible to reverse the rotation direction of the rotor 6 the means 85, 86 are omitted. In the embodiments of the operational components of the motor 200, shown in FIGS. 40, 41, 42 half-bridge circuits including bipolar or field-effect transistors (not shown) are used as buffer amplifiers 80, 83, 84 operating as voltage control. Such circuits provide electric voltage amplitudes at the generators 9, 10, 11 equal to half the supply voltage. Provided that higher voltages are required, circuits including current change-overs can be employed. Such circuits provide a voltage at the generators which is 2 to 3-fold higher the voltage supplied by the power amplifiers.

Figure 43:
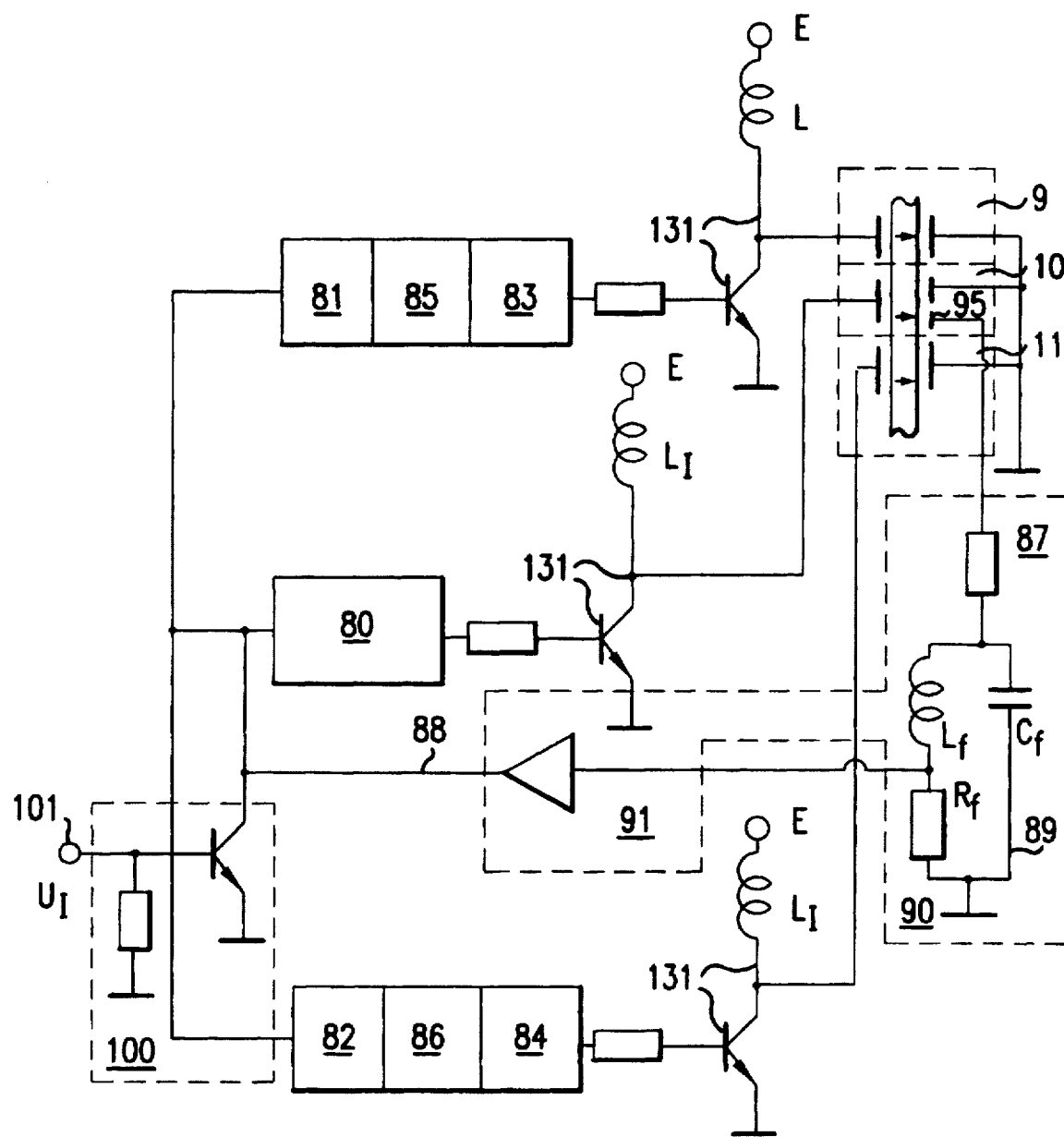

FIG. 43 shows an embodiment of the motor comprising motor comprising current switches. Said embodiment includes three current reverse circuits 131 supplied by a voltage E and embodied as bipolar transistors with a current source set-up by an inductor $L_I$ in the collector circuit. The voltage amplitude at the generators 9, 10, 11 is about $(2-3) \cdot E$. In this embodiment, the feedback branch 87 is connected to the feedback electrode 95 which, at the frequency $f_O$, generates a phase shift of $+90°$ between the voltage across the generator 9 and the voltage across said electrode 95 (FIG. 29, position 97). The phase shift chain 90 of the band-pass filter 89 rotates the phase again by $+90°$ so that the total phase shift is $+180°$. The rotation of the phase in opposite direction by $-180°$ is performed by the amplifier 91. This modification represents a piezoelectric motor operating in step mode having a short start-stop-time, set-up in accordance with the block diagram of FIG. 31. To provide for step operation, the circuit includes a transistor switch 100 controlled via the input 101 pulse voltage. When the switch 100 is closed, the feedback is split up causing a rapid stop of the oscillations of the electromechanic generators. When the switch 100 is opened, the auto-generator is rapidly started.

Figure 44:
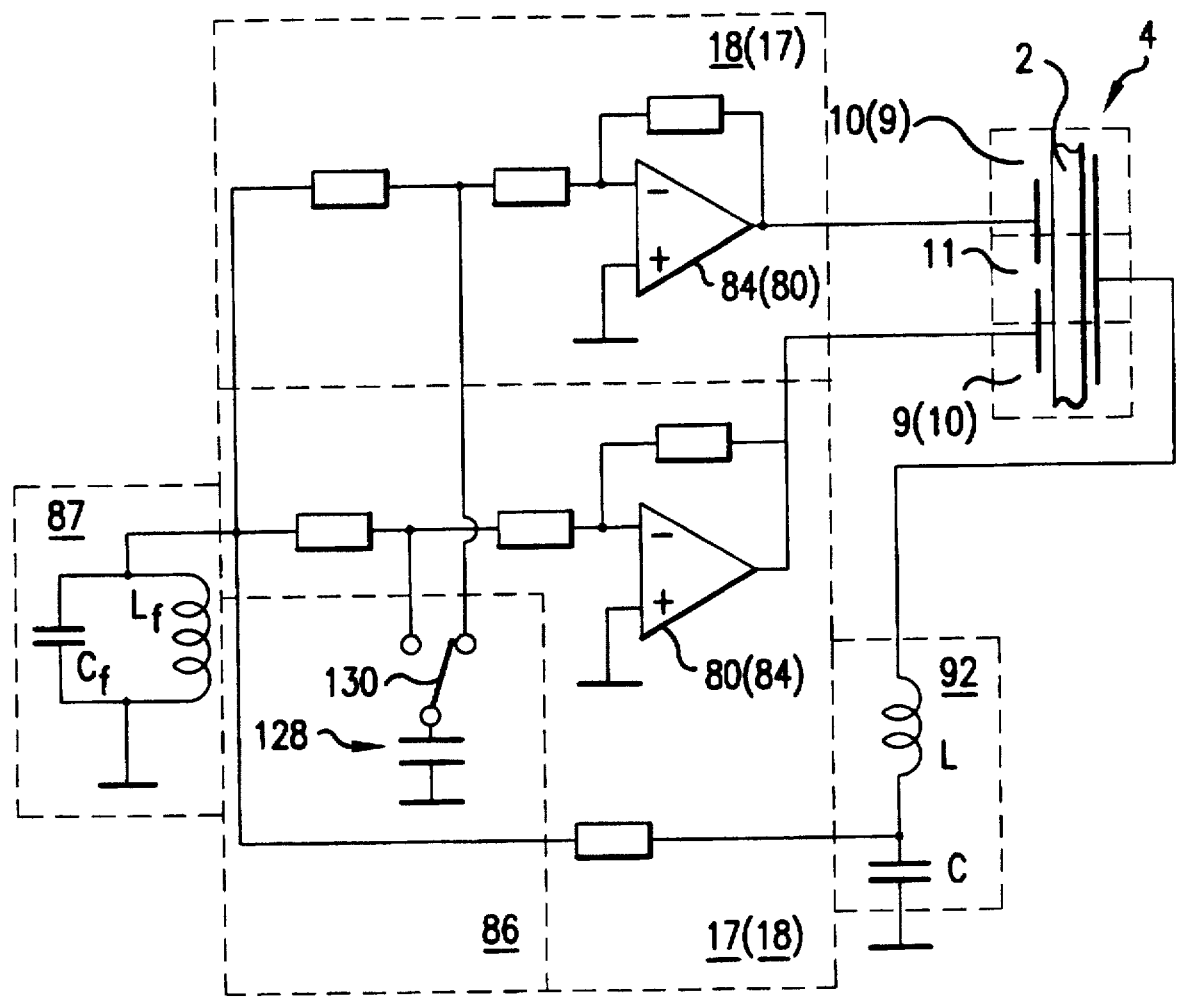

FIG. 44 shows an electric circuit of the motor in which the portions of the voltages $U_1$ and $U_2$ exciting the generators 9, 10 are summed up. The circuit is set-up in a manner that, when actuating a change-over switch 130, the excitation sources 17, 18 and the generators 9, 10 are operationally exchanged. This, in a simple way, permits the reversal of the rotation direction of the motor. As concerns further components, the reference numerals used hereinbefore are valid. In the entire feasible embodiments of the piezoelectric motor, the piezoelectric ceramic occupies the maximum obtainable volume of the oscillator. Therefore such motors are distinguished by a highly effective oscillator of a maximum electromechanic coefficient. They only require a low excitation voltage and permit high loads, that is, they also work when the oscillator is subject to high mechanical stress. The monolithic oscillator of such motors has a high stability which permits a maximum mechanical stress and, hence, a maximum oscillation speed which, in turn, ensures a maximum mechanic output of the motor axle.

Thus, the motor provides, for example, a specific mechanical output of 10 W/cm$^2$ operational face at a specific tangential load on the operational face of the oscillator of 10 N/cm$^2$ and at an oscillation speed of the operational face of 1 m/s. That is, the attainable maximum mechanical output of the motor is 450 W at an oscillator diameter of 100 mm and at an operational face width of 15 mm.

The high mechanical stability of the oscillator ensures the high reliability and the long life of the motor which approximates the reliability of solid components. The simple design reduces the net costs which renders said motor competitive to conventional electromotors.

List of Reference Numerals

1—stator
2—oscillator
3—waveguide
4—travelling wave generator
5—operational face of the oscillator 2
6—rotor
7—leading face of the oscillator 2
8—sound isolating support
9—basic generator for standing waves
10, 11—boosters (additional generators) for standing waves
12, 13, 14—oscillator sections
15 16—electrodes of standing wave generators
17, 18, 19—excitation sources, (voltage sources)
20, 21 contacts of excitation sources
22—central line of oscillator
23, 24, 25—deformation diagrams of operational face 5
26, 27, 28—deformation states of operational face 5
29—travelling wave curve
30, 31, 32, 33—path of travel of points
34—elementary volume of oscillator
35—elementary oscillation system
36—elementary equivalent circuit
37, 38, 39—equivalent circuits of standing wave generators
40—friction transducer
41–46—electromechanic motor parameters
47–54—oscillator embodiments
55–64—modification of friction layers
60–69—arrangements of electrodes
70—lines
71—special arrangement of electrodes
72—developed oscillator (schematic view) including special electrode arrangement
73, 74, 75—block diagram
76—collective conductor
77—common electrode
78—connection line
79—control generator
81, 82—phase shift means
80, 83, 84—buffer amplifiers
85, 84—means for pole reversal of phase angle
87—feedback branch
88—input of feedback branch
89—band-pass filter 90—phase shift chain
91—amplifier
92—impedance
93—current transformer
94—part oscillator
95—feedback electrode
96–98—characteristic of feedback electrode
99—resistor
100—switch
101—control input
102—mounting base
103—insulating backing
104—spring
105—elastic sleeve
106—axle
107—ballbearing
108, 109—portions of the rotor
110—conical operational faces
111—elastic support
112—nut
113—washer
114—housing
115—jolted bolt
116—packets of transducer
117—bolt
118—flange
119—annular magnet
120—magnetic conductive housing
121—autogenerator with wien-bridge
122—capacitor
123, 124—phase-shift branches
125, 126—change-over switches
127, 128—phase chains
129, 130—change-over switches
131—current reverse circuit
150, 151—arrows
200—piezoelectric motor
231—opening
500, 700—waves
600—friction layer
880—conductor
881—possible connection
X-X—axis

I claim:

1. A piezoelectric motor comprising:

a rotor;

a stator in the form of hollow cylindrical waveguide formed of a piezoelectric material which is homogeneously polarized uniformly in a polarization direction which is in a radial direction of said hollow cylindrical waveguide, said hollow cylindrical waveguide having a first end surface, a second end surface, an external cylindrical surface and an internal cylindrical surface;

said rotor being in contact with said first end surface of said hollow cylindrical waveguide;

generators for generating an longitudinal traveling wave, in the form of an expansion-compression traveling wave having a wave length λ and traveling circumferentially on said first end surface, said longitudinal traveling wave being generated from expansion-compression standing waves on said first end surface generated said generators;

each of said generators including:

a first generator for producing a first expansion-compression standing wave of said expansion-compression standing waves, said first generator including first and second electrodes respectively on said external cylindrical surface and said internal cylindrical surface which extend perpendicularly to said polarization direction and oppose one another and are disposed on a first sector of said hollow cylindrical waveguide having a circumferential length of λ/3;

a second generator for producing a second expansion-compression standing wave of said expansion-compression standing waves, said second generator including first and second electrodes respectively on said external cylindrical surface and said internal cylindrical surface which extend perpendicularly to said polarization direction and oppose one another and are disposed on a second sector of said hollow cylindrical waveguide having a circumferential length of λ/3;

a third generator for producing a third expansion-compression standing wave of said expansion-compression standing waves, said third generator including first and second electrodes respectively on said external cylindrical surface and said internal cylindrical surface which extend perpendicularly to said polarization direction and oppose one another and are disposed on a third sector of said hollow cylindrical waveguide having a circumferential length of λ/3;

said first, second and third sectors being disposed adjacent one another and together forming a generator sector having a circumferential length of λ; and energizing means for driving said first and second electrodes of said first, second and third generators such that said first, second and third expansion-compression standing waves are phase shift from each other by 2 π/3 to produce said expansion-compression traveling wave having said wave length λ to rotate said rotor by means of frictional contact between said first end surface and said rotor; and said hollow cylindrical waveguide having a circumferential length equal to N number of said wave length λ of said expansion-compression traveling wave wherein N is an integer equal to at least one, and said generators including N number of said generators with said generator sectors thereof disposed adjacent one another.

2. The piezoelectric motor as claimed in claim 1, wherein one of said first and second electrodes of said first, second and third generators are formed in common.

3. The piezoelectric motor as claimed in claim 1, wherein N equals 2 and said generators are uniformly distributed over said hollow cylindrical waveguide.

4. The piezoelectric motor as claimed in claim 1, wherein:

said energizing means include first and second voltage sources for applying voltages to said first, second and third generators; and said first, second and third generators are interconnected to function as a voltage divider with respect to the voltages delivered by said first and second voltage sources, and a summator with respect to the voltages divided.

5. The piezoelectric motor as claimed in claim 1 or 4, wherein said hollow cylindrical waveguide is made of piezoelectric ceramics.

6. The piezoelectric motor as claimed in any one of the claims 1, 3 and 4, wherein said first end face of said hollow cylindrical waveguide is coated with a friction layer contacting said rotor and which is wear resistant.

7. The piezoelectric motor as claimed in claim 6, wherein said friction layer is entirely made of a material forming a chemical compound with a material of said hollow cylindrical waveguide.

8. The piezoelectric motor as claimed in claim 6, wherein the friction layer includes a basic layer and an intermediate layer, said basic layer determining friction properties and the intermediate layer forming a chemical compound with materials of said hollow cylindrical waveguide and the basic layer.

9. The piezoelectric motor as claimed in claim 6, wherein the friction layer is made of a composite material, a base of said material forming a chemical compound with material of said hollow cylindrical waveguide to which a filler material is added to increase a friction coefficient of the friction layer.

10. The piezoelectric motor as claimed in claim 6, wherein the friction layer is made of a porous material of high friction coefficient, and pores of said porous material are filled with a material different from said porous material and which forms a chemical compound with a material of said hollow cylindrical waveguide.

11. The piezoelectric motor as claimed in any of the claims 1, 3 and 4, wherein said energizing means includes a first driver having a voltage signal generator for driving said first generator and second and third drivers each including power amplifiers and phase shifters driven by said voltage signal generator for respectively driving said second and third generators.

12. The piezoelectric motor as claimed in claim 11, wherein said second and third drivers are provided with means for pole reversal of a phase angle.

13. The piezoelectric motor as claimed in claim 11, wherein said voltage signal generator is a frequency-controlled voltage generator.

14. The piezoelectric motor as claimed in claim 1, wherein said energizing means is provided with a positive feedback branch from said generators to form an electro-mechanic auto-generator.

15. The piezoelectric motor as claimed in claim 14, wherein the positive feedback branch is connected to an impedance member being series-connected to said first generator.

16. The piezoelectric motor as claimed in claim 14, wherein the positive feedback branch is connected to a current reversal circuit being series-connected to the first generator.

17. The piezoelectric motor as claimed in claim 14, wherein the positive feedback branch is connected to a feedback electrode.

18. The piezoelectric motor as claimed in claim 14, wherein an electronic switch including a control input for breaking-OFF said positive feedback branch is provided.

* * * * *